(12) United States Patent
Rosen

(10) Patent No.: US 7,519,878 B2
(45) Date of Patent: Apr. 14, 2009

(54) OBTAINING TEST DATA FOR A DEVICE

(75) Inventor: Mark Rosen, Coon Rapids, MN (US)

(73) Assignee: Teradyne, Inc., North Reading, MA (US)

(*) Notice: Subject to any disclaimer, the term of this patent is extended or adjusted under 35 U.S.C. 154(b) by 377 days.

(21) Appl. No.: 11/287,506

(22) Filed: Nov. 22, 2005

(65) Prior Publication Data
US 2007/0043994 A1    Feb. 22, 2007

Related U.S. Application Data

(60) Provisional application No. 60/705,639, filed on Aug. 4, 2005.

(51) Int. Cl.
*G11C 29/00* (2006.01)
(52) U.S. Cl. ............... 714/723; 714/732; 714/724; 714/718; 714/745; 702/117; 702/189
(58) Field of Classification Search .............. None
See application file for complete search history.

(56) References Cited

U.S. PATENT DOCUMENTS

| | | | |
|---|---|---|---|
| 3,655,959 A * | 4/1972 | Chernow et al. ........... 714/718 |
| 6,079,038 A * | 6/2000 | Huston et al. ............. 714/724 |
| 6,418,387 B1 | 7/2002 | Carney | |
| 6,795,788 B2 | 9/2004 | Thatcher et al. | |
| 6,820,021 B2 | 11/2004 | Weller | |
| 6,820,027 B2 | 11/2004 | Weller | |
| 6,847,909 B2 | 1/2005 | Weller | |
| 6,876,207 B2 * | 4/2005 | Haass et al. ............. 324/600 |
| 7,239,319 B2 * | 7/2007 | Loop ...................... 345/467 |
| 2001/0035766 A1 * | 11/2001 | Nakajima ................ 324/765 |
| 2004/0158438 A1 * | 8/2004 | Patten .................... 702/189 |

OTHER PUBLICATIONS

Eldar et al., "The Farthest Point Strategy for Progressive Image Sampling", IEEE, 1997, pp. 1303-1315.*
California Institute of Technology, "Graphics Gems III", edited by David Kirk, Morgan Kaufman, 1992, pp. 358-361.*
Hollasch, S., "Progressive Image Refinement Via Gridded Sampling", Graphics Gems III, ch. VII.5, Morgan Kaufmann / Elsevier, (1992) pp. 358-361.
Eldar et al., "The Farthest Point Strategy for Progressive Image Sampling", IEEE Transactions on Image Processing, vol. 6, No. 9, (1997) pp. 1305-1315.
Ramponi et al., "An Adaptive Irregular Sampling Method for Progressive Transmission", Proceedings International Conference on Image Processing, vol. 2, (1998) pp. 747-751.
International Search Report and Written Opinion in Application No. PCT/US06/29339, dated Jun. 19, 2008.

* cited by examiner

*Primary Examiner*—John P Trimmings
(74) *Attorney, Agent, or Firm*—Fish & Richardson P.C.

(57) ABSTRACT

Obtaining test data for a device under test includes obtaining a first part of the test data by testing the device at first points of a range of parameters using progressive sampling, and obtaining a second part of the test data by testing the device at second points of the range of parameters using adaptive sampling.

16 Claims, 28 Drawing Sheets

OBTAINING TEST DATA FOR A DEVICE

CROSS-REFERENCE TO RELATED APPLICATION

This patent application claims priority to U.S. Provisional Application No. 60/705,639, filed on Aug. 4, 2005, the contents of which are hereby incorporated by reference into this application as if set forth herein in full.

TECHNICAL FIELD

This patent application relates generally to obtaining test data for a device and, more particularly, to obtaining the test data using progressive and adaptive sampling.

BACKGROUND

Semiconductor device performance can vary with changes to a number of different operating parameters. To increase yield and profit for a new device, it is desirable to verify, early on, that the manufacturing process used to produce the device reliably produces devices that are stable over a desired range of operating conditions. It is also useful for quality control during production to sample a fraction of devices to ensure that the manufacturing process continues to produce devices that are stable over the desired range of operating conditions. A test technique that can verify device stability over a range of conditions is commonly known as a "shmoo" or a "shmoo plot".

Shmoo plots can be one-, two-, three-, or even N-dimensional. Each dimension of a shmoo plot represents one or more device parameters that is variable. Such device parameters may include device power supply voltage ($V_{dd}$), device clock frequency/period, and digital input or output voltage. However, any device parameters can be used to verify operation of the device or to identify problems with the device.

Test data, such as that used to generate a shmoo plot, may be obtained from automatic test equipment (ATE). ATE is an automated, usually computer-driven, system for testing devices, such as semiconductors, electronic circuits, and printed circuit board assemblies. A device tested by ATE is referred to as a device under test (DUT).

SUMMARY

This patent application describes methods and apparatus, including computer program products, for obtaining the test data using progressive and adaptive sampling.

In general, in one aspect, the invention is directed to obtaining test data for a device under test, which includes obtaining a first part of the test data by testing the device at first points of a range of parameters using progressive sampling, and obtaining a second part of the test data by testing the device at second points of the range of parameters using adaptive sampling. This aspect of the invention may also include one or more of the features set forth below.

Obtaining the first part of the test data may include determining if a number of first points in the set exceeds a threshold. If the number of first points in the set does not exceed the threshold, this aspect may include repeating performing progressive sampling, testing and performing an interpolation. If the number of first points in the set exceeds the threshold, the second part of the test data may be obtained. Obtaining the second part of the test data may include performing adaptive sampling on the test data to identify a set of second points, testing the device at the set of second points to produce second test results, and performing an interpolation using the second test results to generate part of the test data. Obtaining the second part of the test data may also include setting a metric relating to adaptive sampling, determining if there are additional points on the test data that meet the metric, performing adaptive sampling on the test data to identify another set of second points from the additional points, testing the device at the other set of second points to produce additional second test results, and performing an interpolation using the additional second test results to generate part of the test data.

The foregoing aspect may also include specifying parameters that define the test data, where the test data may include plural points that include the set of first points and the set of second points, and determining if greater than a predetermined amount of the plural points have been subjected to testing. If greater than the predetermined amount of the plural points have not been subjected to testing, this aspect may also include obtaining a third part of the test data by testing the device at third points of the test data identified using progressive sampling. Interpolations may be performed using the first and second parts of the test data to obtain missing parts of the test data, and the test data may be displayed using the first and second parts and the missing parts.

Progressive sampling may include sampling the test data at a substantially uniform distribution to obtain the first points. Adaptive sampling may include sampling the test data based on points of the test data that were sampled previously to obtain the second points. The test data may include a grid having first and second dimensions, where the first dimension corresponds to a first parameter relating to the device and the second dimension corresponds to a second parameter relating to the device. Testing may include obtaining the first parameter given the second parameter, or obtaining the second parameter given the first parameter. The device may include a semiconductor device and the test data may be represented as a shmoo plot.

The details of one or more examples are set forth in the accompanying drawings and the description below. Further features, aspects, and advantages of the invention will become apparent from the description, the drawings, and the claims.

DESCRIPTION OF THE DRAWINGS

Like reference numerals in different figures indicate like elements.

DETAILED DESCRIPTION

Described herein is a method of obtaining test data for a device under test. The method includes obtaining a first part of the test data by testing the device at first points of a range of parameters using progressive sampling, and obtaining a second part of the test data by testing the device at second points of the range of parameters using adaptive sampling. The method is described in the context of generating a shmoo plot, such as those set forth in the figures; however, the invention is not limited to use with generating shmoo plots. Rather, the methods described herein may be used to obtain test data from any device and to represent that test data in any manner whatsoever.

Figure 1:
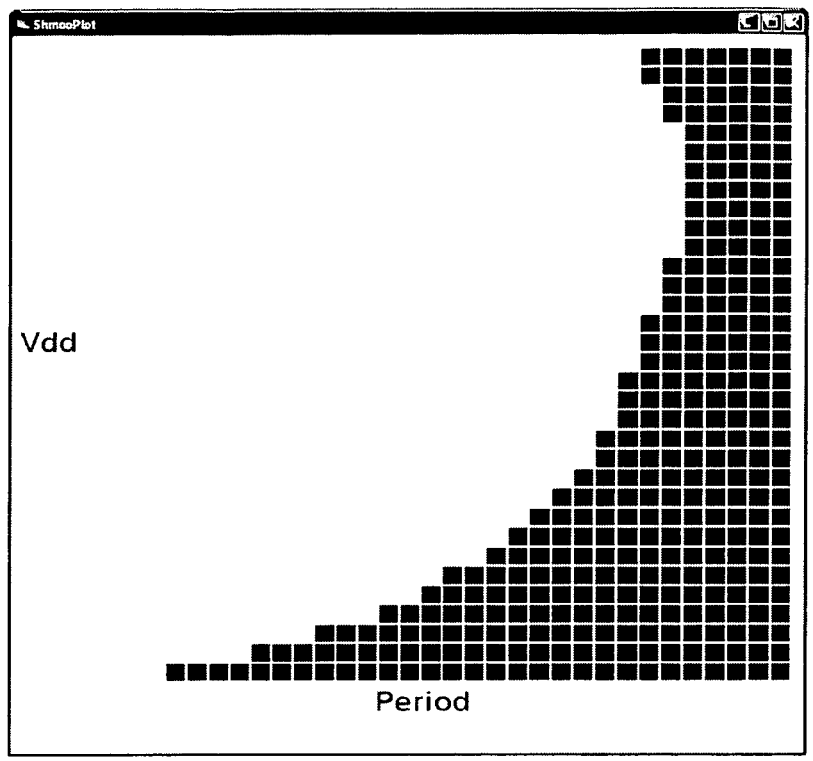
FIGS. 1 to 3 show examples of shmoo plots.
Figure 2:
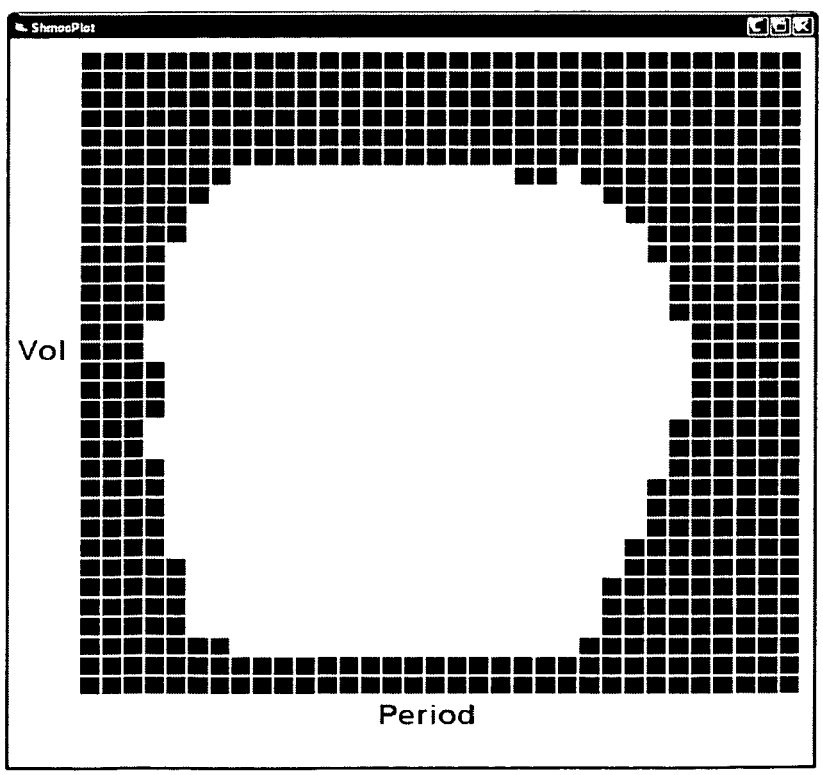
Figure 3:
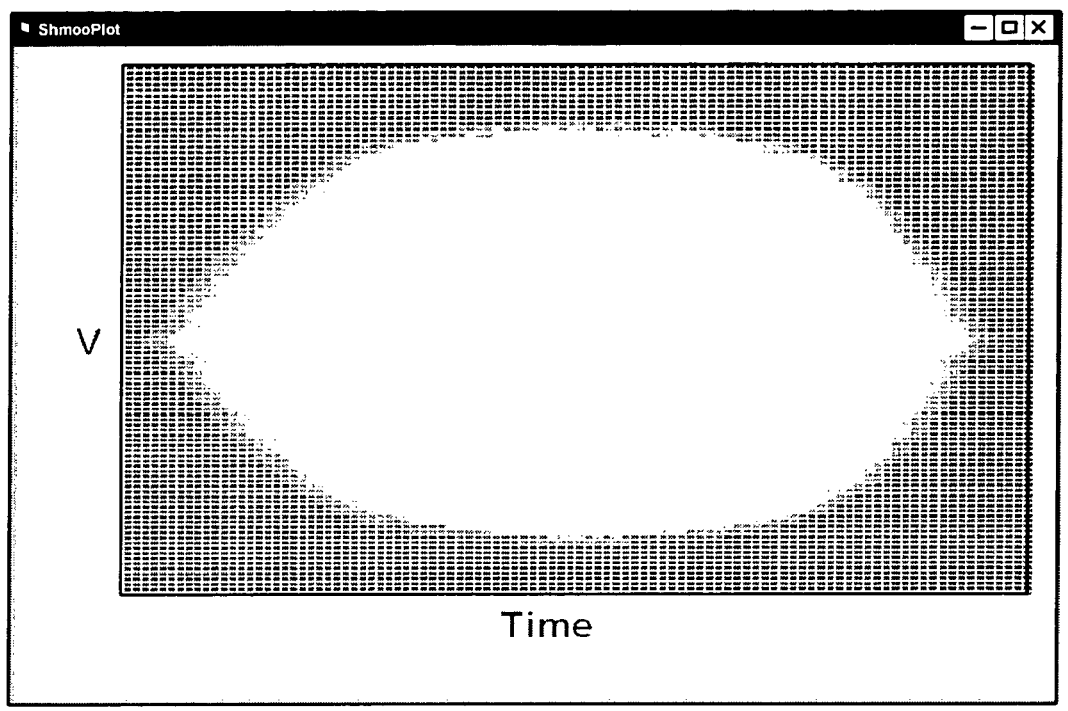

Examples of shmoo plots are shown in FIGS. 1 to 3. FIG. 1 shows a shmoo plot of $V_{dd}$ (device power supply voltage) versus device clock period. FIG. 2 shows a shmoo plot of $V_{ol}$ (digital pin output voltage) versus device clock period. The shmoo plots of FIGS. 1 and 2 are two-dimensional shmoo plots in which two device parameters are varied while measuring a pass/fail result for a test on the device at each intersection of parameter values. Shmoo plots may also be grayscale. FIG. 3 shows a shmoo plot of an "eye diagram", in which the results for eight device pins are tested and plotted simultaneously. White indicates that all eight pins pass the test; black indicates that all eight pins fail the test, and gray indicates that some pins pass the test and some pins fail the test.

Figure 4:
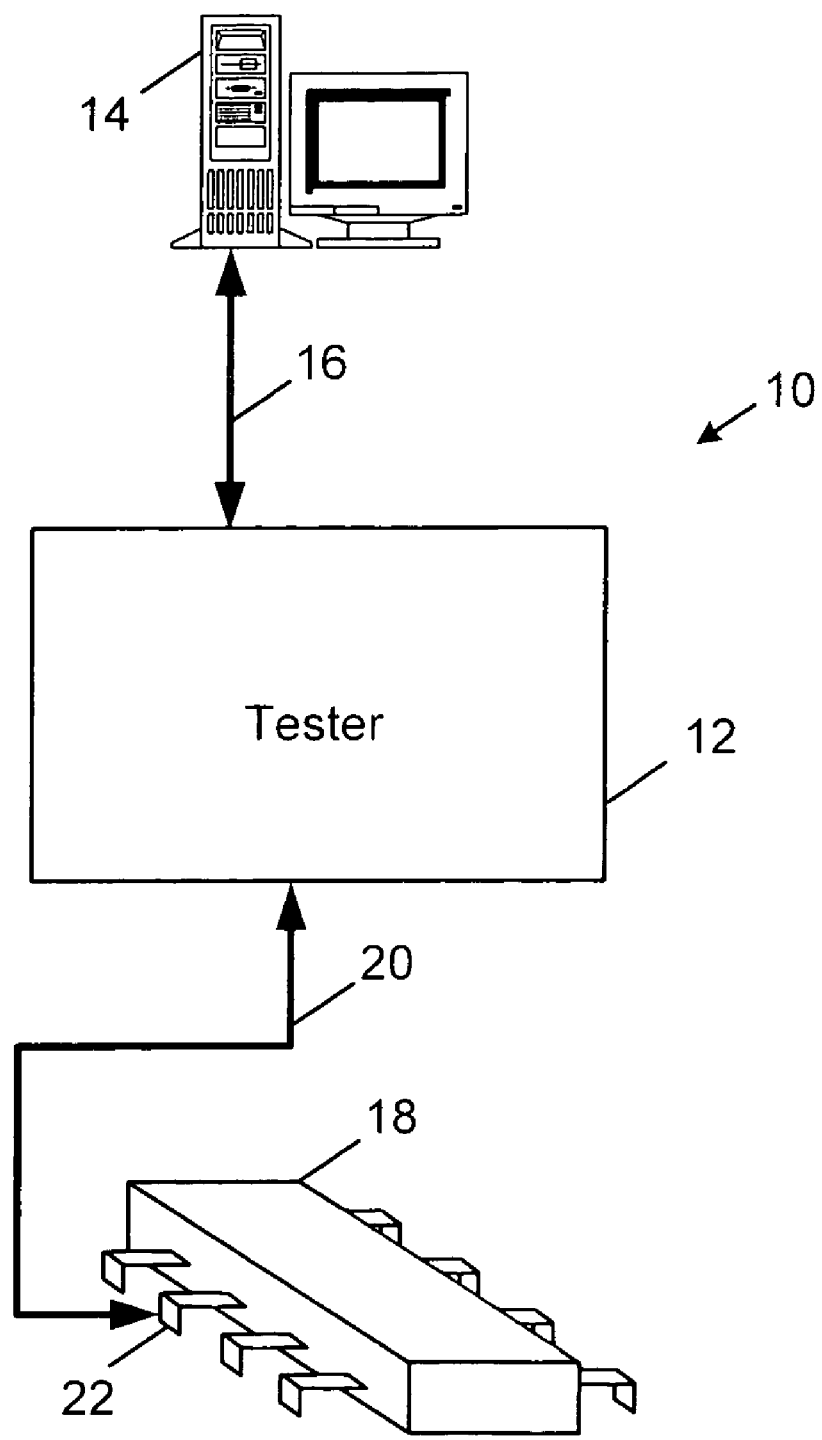
FIG. 4 is a block diagram of ATE for testing devices.

Referring to FIG. 4, a system 10 for testing a device-under-test (DUT) 18, such as a semiconductor device, includes a tester 12 such as automatic test equipment (ATE) or other similar testing device. To control tester 12, system 10 includes a computer system 14 that interfaces with tester 12 over a hardwire connection 16. Typically, computer system 14 sends commands to tester 12 that initiate the execution of routines and functions for testing DUT 18. Such executing test routines may initiate the generation and transmission of test signals to the DUT 18 and collection of responses from the DUT. Various types of DUTs may be tested by system 10. For example, DUTs may be semiconductor devices, such as an integrated circuit (IC) chip (e.g., memory chip, microprocessor, analog-to-digital converter, digital-to-analog converter, etc.).

To provide test signals and collect responses from the DUT, tester 12 is connected to one or more connector pins that provide an interface for the internal circuitry of DUT 18. To test some DUTs, e.g., as many as sixty-four or one hundred twenty-eight connector pins (or more) may be interfaced to tester 12. For illustrative purposes, in this example, semiconductor device tester 12 is connected to one connector pin of DUT 18 via a hardwire connection. A conductor 20 (e.g., cable) is connected to pin 22 and is used to deliver test signals (e.g., PMU test signals, PE test signals, etc.) to the internal circuitry of DUT 18. Conductor 20 also senses signals at pin 22 in response to the test signals provided by semiconductor device tester 12. For example, a voltage signal or a current signal may be sensed at pin 22 in response to a test signal and sent over conductor 20 to tester 12 for analysis. Such single port tests may also be performed on other pins included in DUT 18. For example, tester 12 may provide test signals into other pins and collect associated signals reflected back over conductors (that deliver the provided signals). By collecting the reflected signals, the input impedance of the pins may be characterized, along with other single port testing quantities. In other test scenarios, a digital signal may be sent over conductor 20 to pin 22 for storing a digital value on DUT 18. Once stored, DUT 18 may be accessed to retrieve and send the stored digital value over conductor 20 to tester 12. The retrieved digital value may then be identified to determine if the proper value was stored on DUT 18.

Along with performing one-port measurements, a two-port test may also be performed by semiconductor device tester 12. For example, a test signal may be injected over conductor 20 into pin 22 and a response signal may be collected from one or more other pins of DUT 18. This response signal may be provided to semiconductor device tester 12 to determine such quantities as gain response, phase response, and other throughput measurement quantities.

Figure 5:
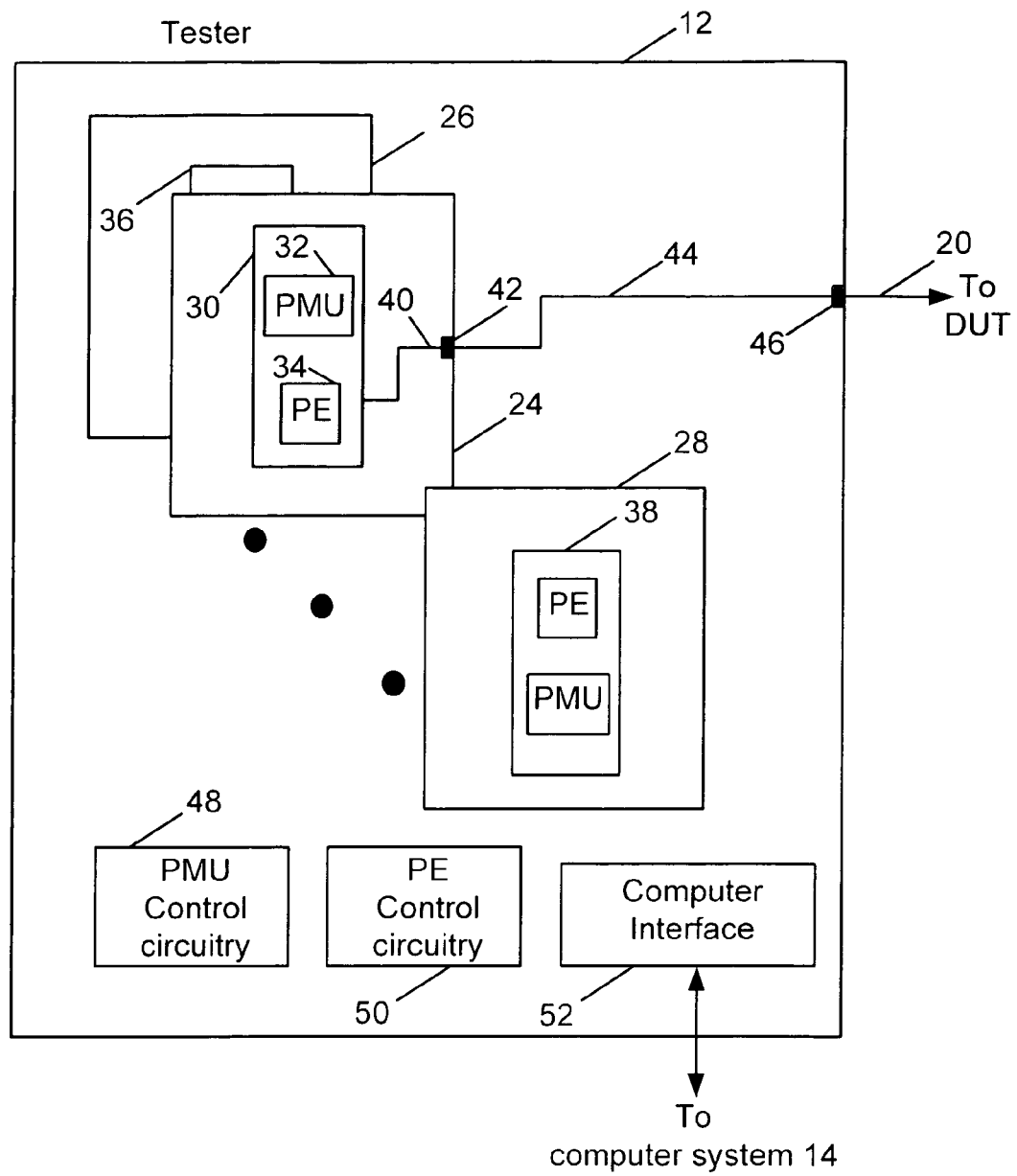
FIG. 5 is a block diagram of a tester used in the ATE.
Figure 6A:
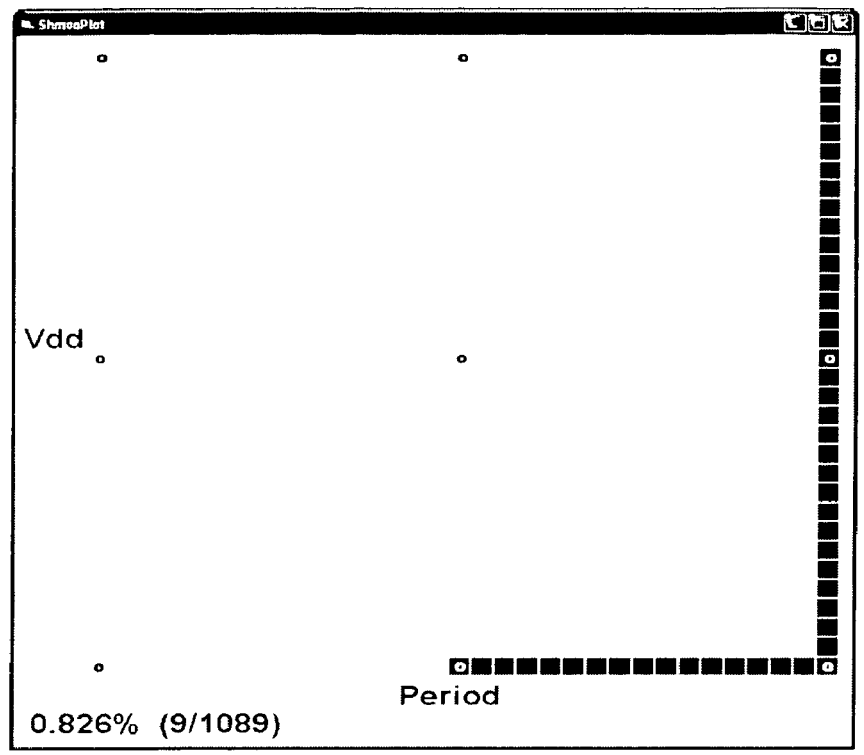
FIGS. 6a to 6e show phases of progressive sampling with pixel copy interpolation.
Figure 6B:
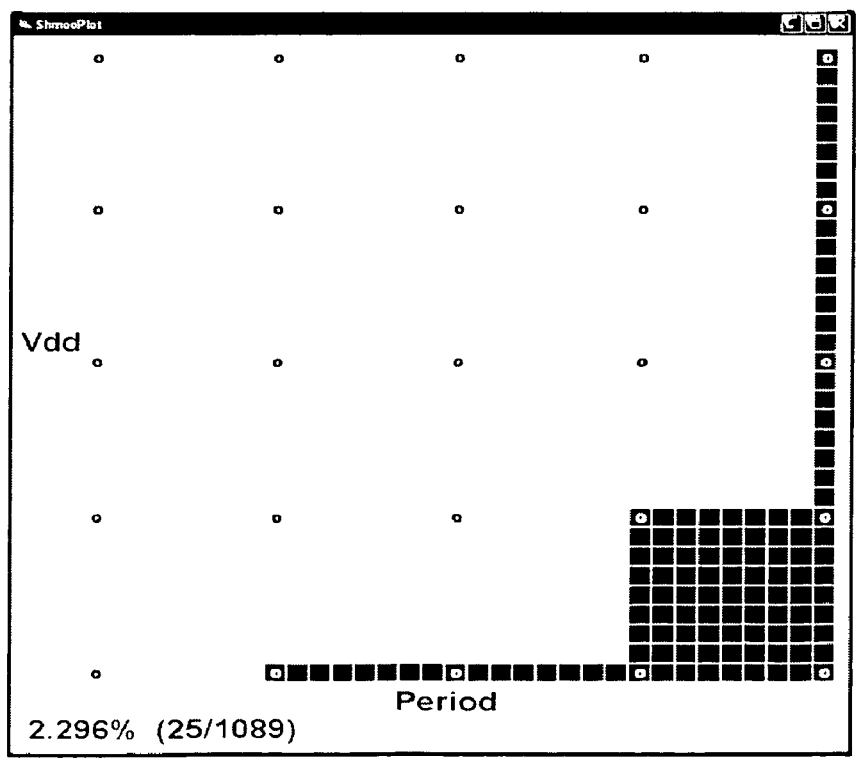
Figure 6C:
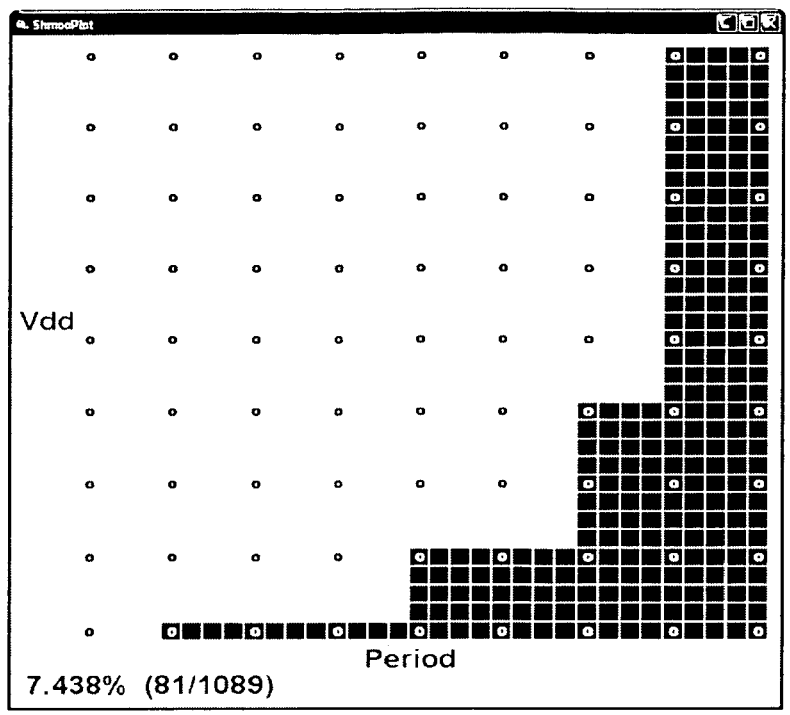
Figure 6D:
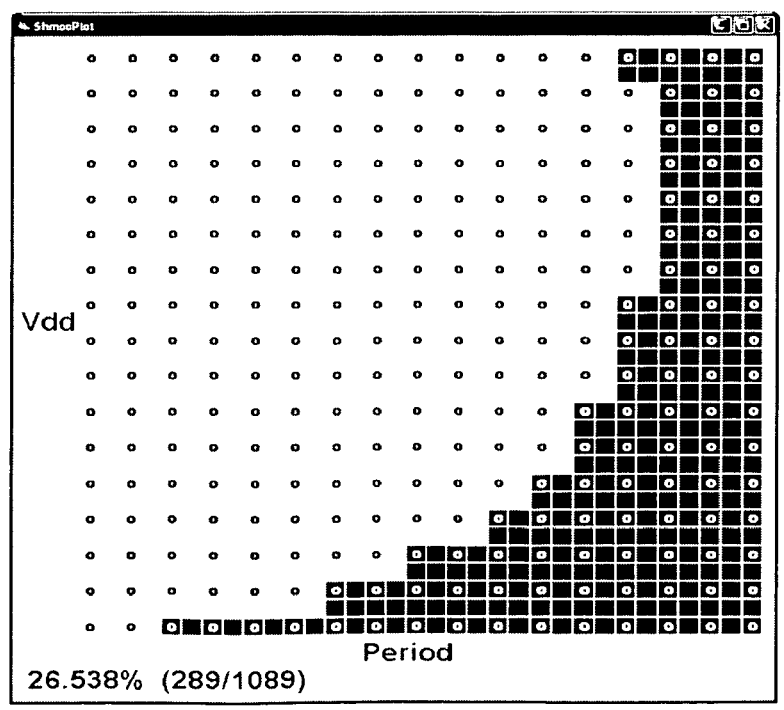
Figure 6E:
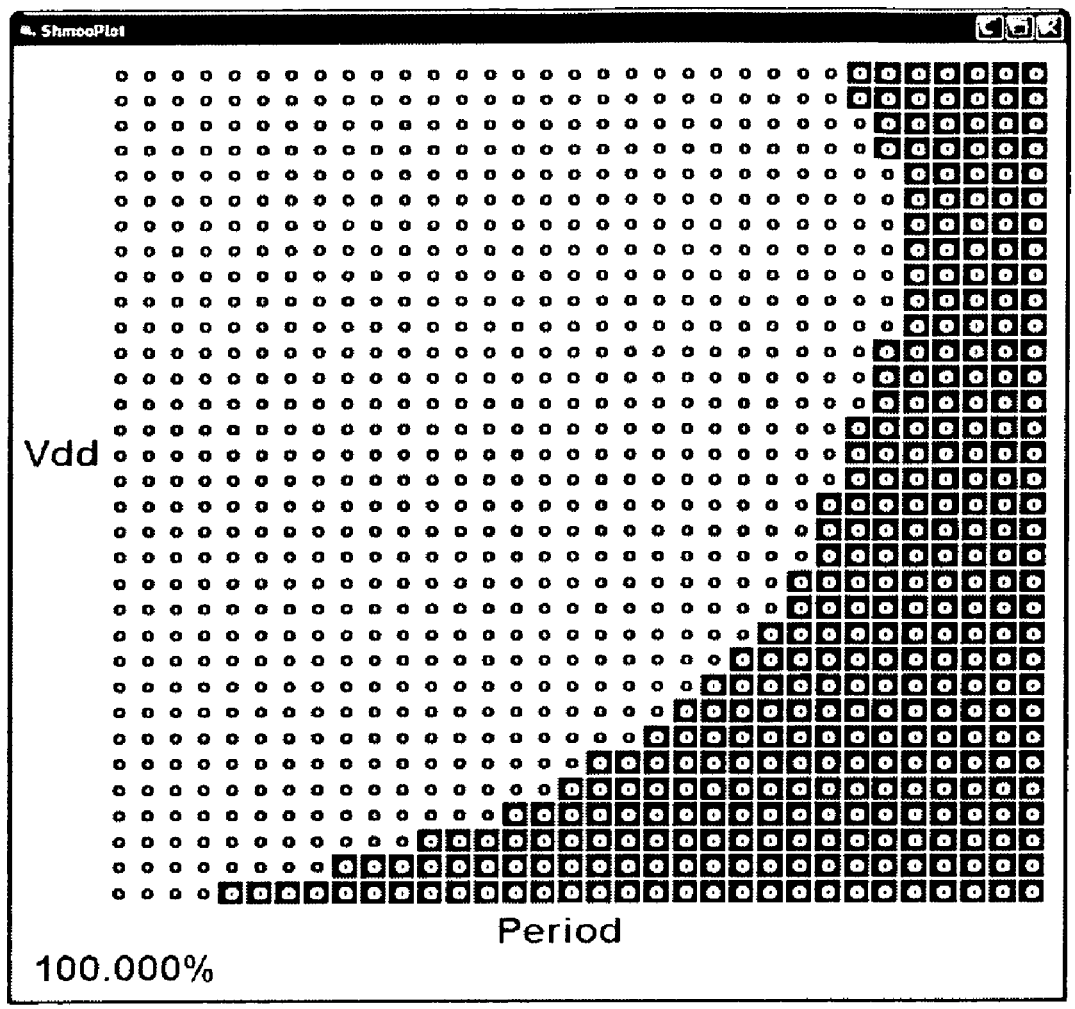

Referring also to FIG. 5, to send and collect test signals from multiple connector pins of a DUT (or multiple DUTs), semiconductor device tester 12 includes an interface card 24 that can communicate with numerous pins. For example, interface card 24 may transmit test signals to, e.g., 32, 64, or 128 pins and collect corresponding responses. Each communication link to a pin is typically referred to as a channel and, by providing test signals to a large number of channels, testing time is reduced since multiple tests may be performed simultaneously. Along with having many channels on an interface card, by including multiple interface cards in tester 12, the overall number of channels increases, thereby further reducing testing time. In this example, two additional interface cards 26 and 28 are shown to demonstrate that multiple interface cards may populate tester 12.

Each interface card includes a dedicated integrated circuit (IC) chip (e.g., an application specific integrated circuit (ASIC)) for performing particular test functions. For example, interface card 24 includes IC chip 30 for performing parametric measurement unit (PMU) tests and pin electronics (PE) tests. IC chip 30 has a PMU stage 32 that includes circuitry for performing PMU tests and a PE stage 34 that includes circuitry for performing PE tests. Additionally, interface cards 26 and 28 respectively include IC chips 36 and 38 that include PMU and PE circuitry. Typically PMU testing involves providing a DC voltage or current signal to the DUT to determine such quantities as input and output impedance, current leakage, and other types of DC performance characterizations. PE testing involves sending AC test signals and waveforms to a DUT (e.g., DUT 18) and collecting responses to further characterize the performance of the DUT. For example, IC chip 30 may transmit, to the DUT, AC test signals that represent a vector of binary values for storing on the DUT. Once these binary values have been stored, the DUT is accessed by tester 12 to determine if the correct binary values have been stored. Since digital signals typically include abrupt voltage transitions, the circuitry in PE stage 34 on IC chip 30 operates at a relatively high speed in comparison to the circuitry in PMU stage 32.

To pass both DC and AC test signals and analog waveforms from interface card 24 to DUT 18, a conducting trace 40 connects IC chip 30 to an interface board connector 42 that allows signals to be passed on and off interface board 24. Interface board connector 42 is also connected to a conductor 44 that is connected to an interface connector 46, which allows signals to be passed to and from tester 12. In this example conductor 20 is connected to interface connector 46 for bidirectional signal passing between tester 12 and pin 22 of DUT 18. In some arrangements, an interface device may be used to connect one or more conductors from tester 12 to the DUT. For example, the DUT (e.g., DUT 18) may be mounted onto a device interface board (DIB) for providing access to each DUT pin. In such an arrangement, conductor 20 may be connected to the DIB for placing test signals on the appropriate pin(s) (e.g., pin 22) of the DUT.

In this example, only conducting trace 40 and conductor 44 respectively connect IC chip 30 and interface board 24 for delivering and collecting signals. However, IC chip 30 (along with IC chips 36 and 38) typically has multiple pins (e.g., eight, sixteen, etc.) that are respectively connected with multiple conducting traces and corresponding conductors for providing and collecting signals from the DUT (via a DIB). Additionally, in some arrangements, tester 12 may connect to two or more DIB's for interfacing the channels provided by interface cards 24, 26, and 28 to one or multiple devices under test.

To initiate and control the testing performed by interface cards 24, 26, and 28, tester 12 includes PMU control circuitry 48 and PE control circuitry 50 that provide test parameters (e.g., test signal voltage level, test signal current level, digital values, etc.) for producing test signals and analyzing DUT responses. PMU control circuitry 48 and PE control circuitry 50 may be part of one or more ICs or may be implemented via a processing device, such as a digital signal processor (DSP). Tester 12 also includes a computer interface 52 that allows computer system 14 to control the operations executed by tester 12 and also allows data (e.g., test parameters, DUT responses, etc.) passing between tester 12 and computer system 14.

Computer system 14 obtains test results from tester 12 according to the process described herein. In this example, the process generates one or more shmoo plots based on those test results; however, any other types of representation may be generated. Such representations may be graphical, as in the case of shmoo plots or not graphical. The process described herein is based, in part, on progressive and adaptive sampling techniques. Briefly, the process includes obtaining a first part of test data by testing the device at first points of a range of parameters identified using progressive sampling, and obtaining a second part of the test data by testing the device at second points of the range of parameters identified using adaptive sampling. The second part of the test data may include data missing from the first part. A more detailed explanation follows, starting with descriptions of progressive and adaptive sampling techniques.

Progressive sampling was developed as a way to transmit digital images across slow data paths so that a low-resolution version of the image could be displayed quickly, and then image quality could be incrementally improved as more image data was transmitted. One type of progressive sampling, called grid sampling, samples an image on a coarse grid and interpolates the remaining pixel by copying sampled pixels down and to the right in order to fill in the missing pixels. Then, the next phase of progressive sampling is performed at twice the resolution of the previous grid and interpolated via the same pixel-copy technique. This continues until all pixels are sampled. FIGS. 6a to 6e show phases of this type of progressive sampling in the context of the shmoo plot of FIG. 1. The progressive sampling may be performed outside a shmoo plot context.

Figure 7A:
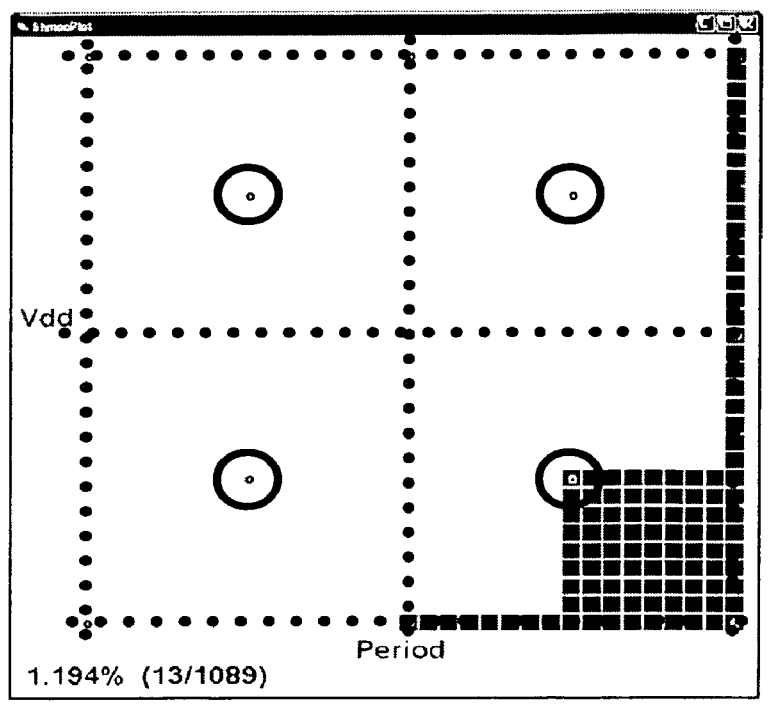
FIGS. 7a to 7c show phases of progressive sampling with sub-phase sampling.
Figure 7B:
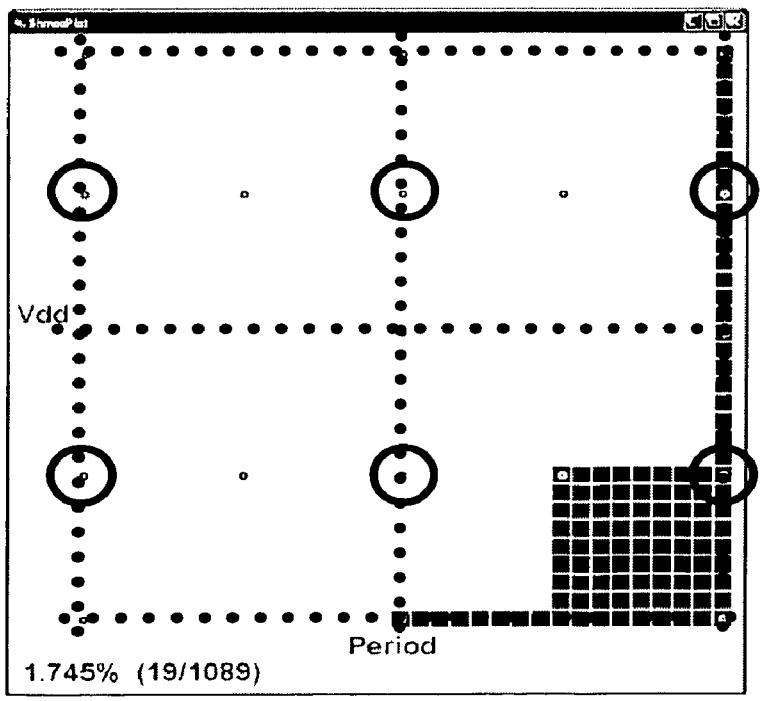
Figure 7C:
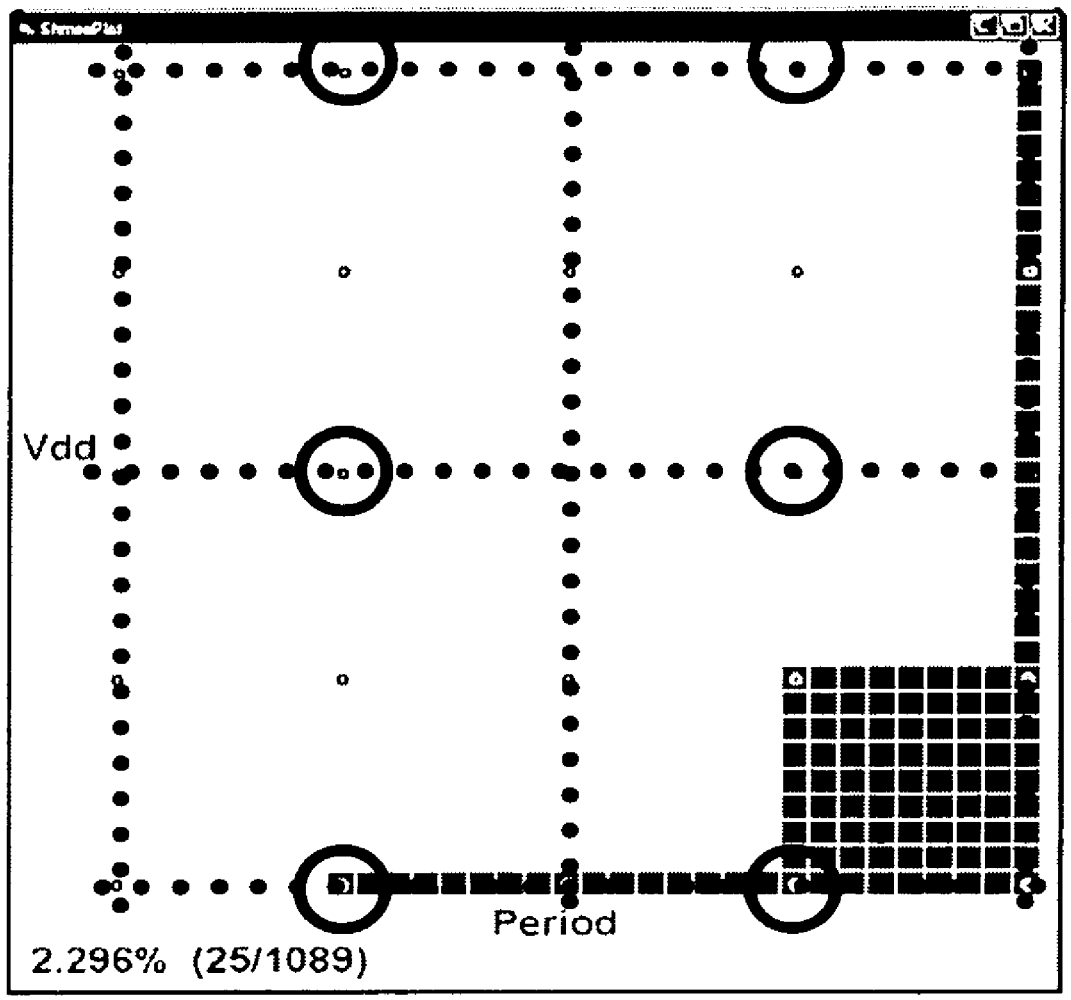

Progressive grid sampling, as shown in FIGS. 6a to 6e, has four times the number of points sampled in each successive phase to produce a next level of grid. If smaller progressive increments are desired, it is possible to break the phases shown in FIGS. 6a to 6e into three smaller sub-phases. FIGS. 7a to 7c shows how the phase in FIG. 6b can be broken down into three smaller sub-phases. The first sub-phase (FIG. 7a) samples points at a center of the previous grid. The second sub-phase (FIG. 7b) samples points at vertical centers between the points in the previous grid. The third sub-phase (FIG. 7c) samples points at horizontal centers between the points in the previous grid.

Adaptive sampling uses points sampled previously as a basis for choosing the next point to sample, with the goal of preferentially sampling points with high information content. In a shmoo plot, information is typically concentrated along pass/fail transitions. Accordingly, in a shmoo context, adaptive sampling concentrates on pass/fail transitions. In other contexts, this may not be the case.

Figure 8:
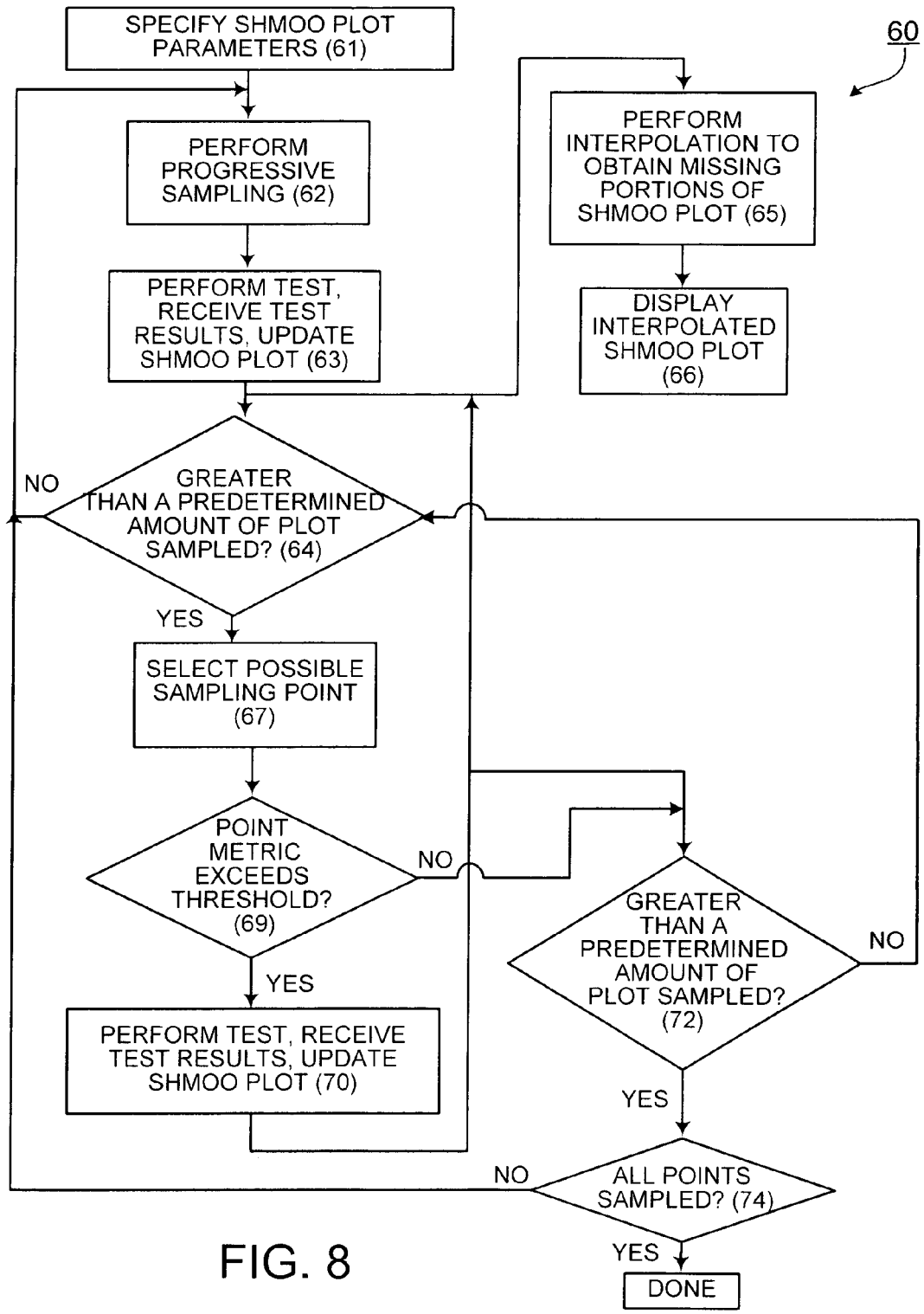
FIG. 8 shows a process for generating shmoo plots.

FIG. 8 shows a process 60 for obtaining test data that uses progressive and adaptive sampling. It is noted that process 60 is described in the context of shmoo plots; however, process 60 can be applied to obtain test data in any context and to represent, or not represent, that test data graphically. Furthermore, process 60 can be applied to shmoo plots of any dimensionality (i.e., any range of parameters), even though process 60 is described herein in the context of two-dimensional plots.

Process 60 begins by specifying (61) parameters that define the shmoo plot, such as $V_{dd}$, clock period, or the like, along with the desired resolution of the shmoo plot. Process 60 performs (62) progressive (approximately) uniform sampling of the shmoo plot until a predetermined amount points in the shmoo plot have been sampled (64). At each sampled point, a device test is performed (63). Process 60 receives the test results and incorporates them into the sampled points of the shmoo plot. For example, if a test is performed at a specific $V_{dd}$ value and at a specific clock period, process 60 updates the shmoo plot to reflect the results of the test, e.g., pass (white) or fail (black).

After each phase of progressive uniform sampling, process 60 performs interpolation (65) on the shmoo plot to obtain missing points of the shmoo plot using the test data obtained from the sampled points. In a non-shmoo plot context, interpolation may simply be performed to interpolate test data from obtained test data. Process 60 thereafter displays (66) the resulting, interpolated shmoo plot (or other representation, as the case may be). Once more than a predetermined amount (e.g., percentage) of points have been sampled (64) on the shmoo plot through progressive sampling, process 60 switches to performing adaptive sampling using the interpolated shmoo plot.

Adaptive sampling is also performed in phases. Candidate points for sampling may be selected (67) by continuing progressive uniform sampling; however, not all points are actually sampled. The decision to sample or not sample a given point is made by an evaluator module. The evaluator module defines a metric for each unsampled point in the shmoo plot. The metric may be determined from the interpolated shmoo plot from the immediately prior sampling phase. If the metric exceeds a predefined threshold (69), then the point is sampled (70) using adaptive sampling. That is, at each sampled point, a device test is performed. Process 60 receives the test results and incorporates them into the sampled points of the shmoo plot (or other representation, as the case may be).

Once a phase of adaptive sampling is complete, process 60 performs interpolation (65) to obtain missing points of the shmoo plot, and process 60 displays (66) the resulting, interpolated shmoo plot. As explained above, in a non-shmoo context, process 60 performs interpolation (65) simply to obtain missing data. Thereafter, a next phase of adaptive sampling may be performed using the resulting, interpolated shmoo plot as a baseline. In a case where the point metric does not exceed the threshold (69), greater than a predetermined amount of the shmoo plot has been sampled (72), and all points have not been sampled (74), process 60 performs an additional phase of progressive uniform sampling followed by a return to adaptive sampling. This is continued until the entire shmoo plot is sampled or a user terminates sampling, e.g., manually or by specifying beforehand a maximum amount of sampling to be performed by process 60.

More specifically, once a phase of progressive uniform sampling is completed, then adaptive sampling may be resumed if new features have been found in the shmoo plot. If no new features have been found, then another phase of progressive uniform sampling may be performed and process 60 may continue until either the user stops the sampling or until all points in the shmoo plot have been sampled.

Further details of specific parts of process 60 are provided below.

Examples of progressive uniform sampling that may be used in process 60 include grid sampling performed in sub-phases as described above with respect to FIGS. 6a to 6e and FIGS. 7a to 7c, and pseudo-poisson disk (PPD) random sampling as described in G. Ramponi and S. Carrato, "An Adaptive Irregular Sampling Method for Progressive Transmission", Proceedings International Conference on Image Processing, Vol. 2, 1998, pp. 747-751, the contents of which are hereby incorporated by reference into this application as if set forth herein in full. For example, in one implementation, random sampling is performed in phases that include 2.5% of the points in the shmoo plot, and the threshold percentage for switching from progressive sampling to adaptive sampling is 6% of the points in the shmoo plot. In a non-shmoo plot context, the random sampling may be performed on similar percentages of data. Process 60 performed using grid sampling is referred to as "progressive adaptive grid sampling", and process 60 performed using random sampling is referred to as "progressive adaptive random sampling".

Traditional image interpolators, such as bilinear and bicubic interpolators, may be used to perform the interpolation of process 60. In one implementation, the interpolator is similar to a bilinear interpolator and similar to the four nearest neighbor (4NN) interpolator described in "An Adaptive Irregular Sampling Method for Progressive Transmission", which was incorporated by reference above. In this case, interpolation may be performed by converting samples in the shmoo plot into eight-bit grayscale (256 values). Pass values are set to 255 and fail values to zero prior to interpolation. The interpolator operates by looking at larger and larger square regions around a point to be interpolated until at least two sampled point are found. The interpolator then performs linear interpolation based on the two, three or four nearest sampled points within that square. If additional sampled points are found within a square, and the points are the same distance from the interpolated point as the fourth point, then those points are also used in the interpolation The evaluator should be capable of edge detection, since adaptive sampling of a shmoo plot ideally samples points near transitions in the shmoo plot. It is possible to use traditional image processing edge detectors, such as a 3×3 Sobel filter or a 3×3 gradient filter, as the evaluator metric. But, because of the simple structure of shmoo plots, it was found that it is more effective to simply use the value that results from interpolation as the evaluator metric. It was also found that 3×3 edge detectors cause more points in the shmoo plot to be sampled because they cause sampling to occur in a wider band around transitions than if the simple evaluator is used.

A simple evaluator based on the interpolated value of a point works well because points near edges where dense sampling is desired will have values different than the pass (255) or fail (0). For bi-level shmoo plots, the evaluator threshold may be selected so that points that are greater than 2.5% away from pass or fail (grayscale values between 7 and 248) will be sampled, whereas values outside this range will not be sampled. Grayscale shmoo plots are more sensitive to the threshold level; therefore, in this case, a threshold is used so that points that are greater than 1% away from pass or fail (grayscale values between 3 and 252) may be sampled, whereas values outside this range will not be sampled. Note that if a shmoo plot is so complex that it resembles a grayscale photographic image, it may be necessary to use a 3×3 Sobel or gradient edge detector as the evaluator to preferentially sample around edges in the shmoo plot.

In one implementation, the adaptive sampling used by process 60 involves sampling all points that exceed the evaluator's metric in one progressive grid sampling sub-phase. The adaptive sampling involves randomly selecting points in the grid and sampling such points if they exceed the evaluator's metric. Each phase of adaptive sampling continues until 2.5% more points are sampled or until the number of randomly selected candidate points exceeds sixteen times the total number of points in the shmoo plot. Imposing a limit on the number of candidate points to consider during this random sampling prevents adaptive sampling from taking a long time, but may result in more random, uniform sampling and less adaptive sampling than in grid sampling.

Figure 9A:
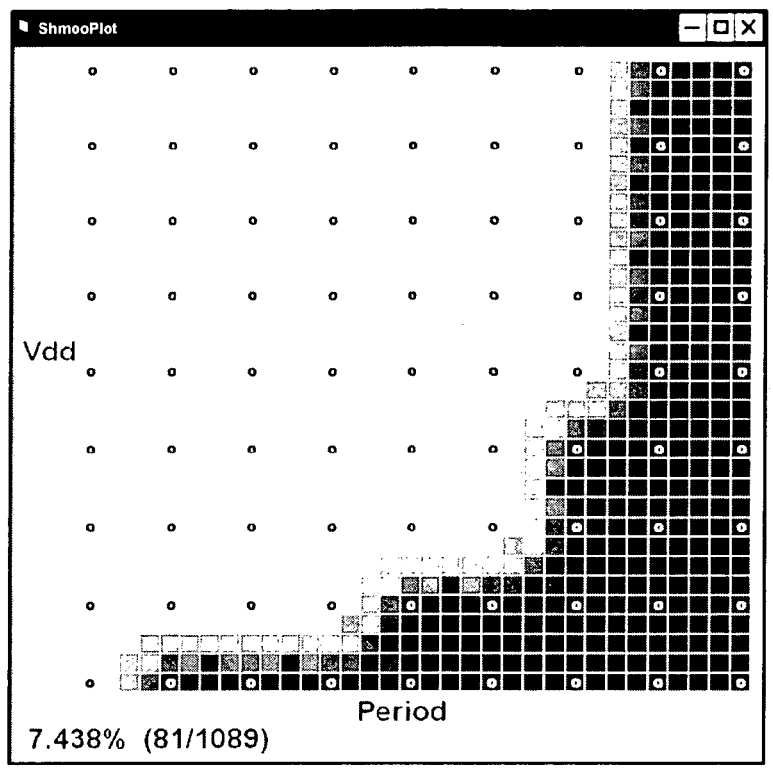
FIGS. 9a to 9c show three phases of the shmoo plot of FIG. 1 generated using progressive adaptive grid sampling.
Figure 9B:
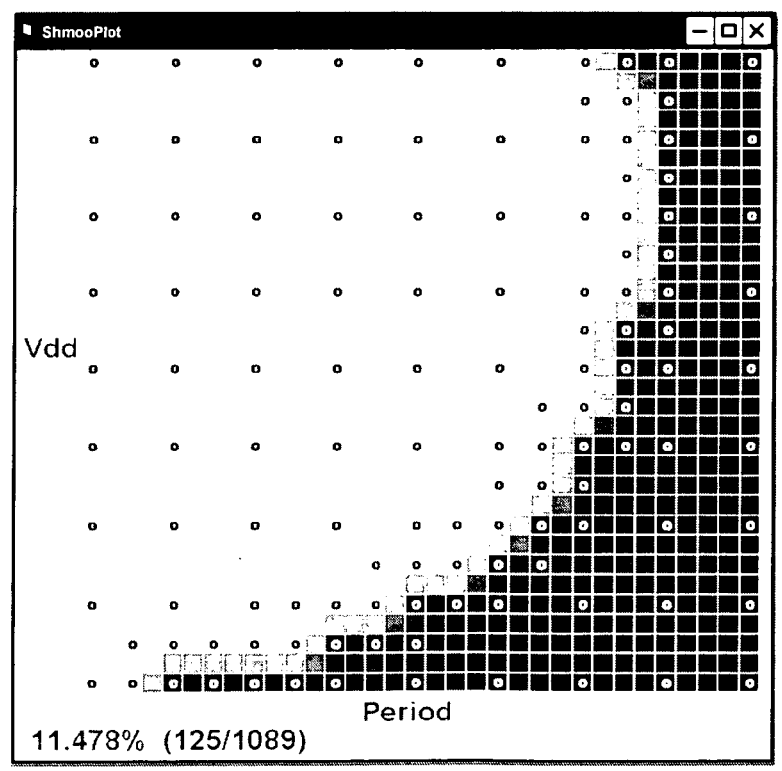
Figure 9C:
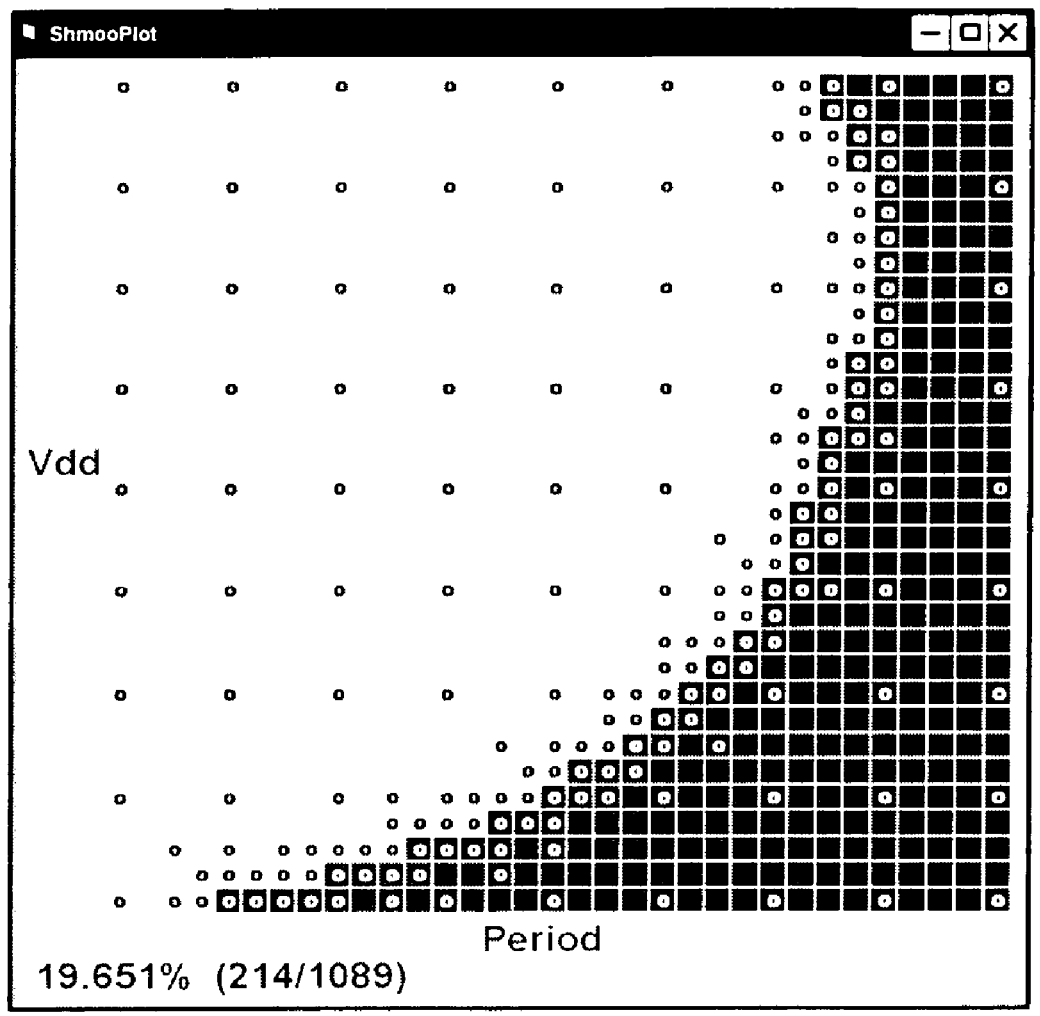

FIGS. 9a to 9c show the result of process 60 performed to generate the shmoo plot of FIG. 1 using progressive adaptive grid sampling. Sampled points are identified by an O. FIG. 9a shows a shmoo plot that is generated after completing progressive uniform sampling with 7.4% of the points sampled. FIG. 9b shows a shmoo plot that is generated after completing four phases of adaptive sampling with 11.5% of the points sampled. FIG. 9c shows a shmoo plot that is generated after completing adaptive sampling with 19.7% of points sampled. The shmoo plot of FIG. 9c is substantially identical to that of FIG. 1.

Figure 10A:
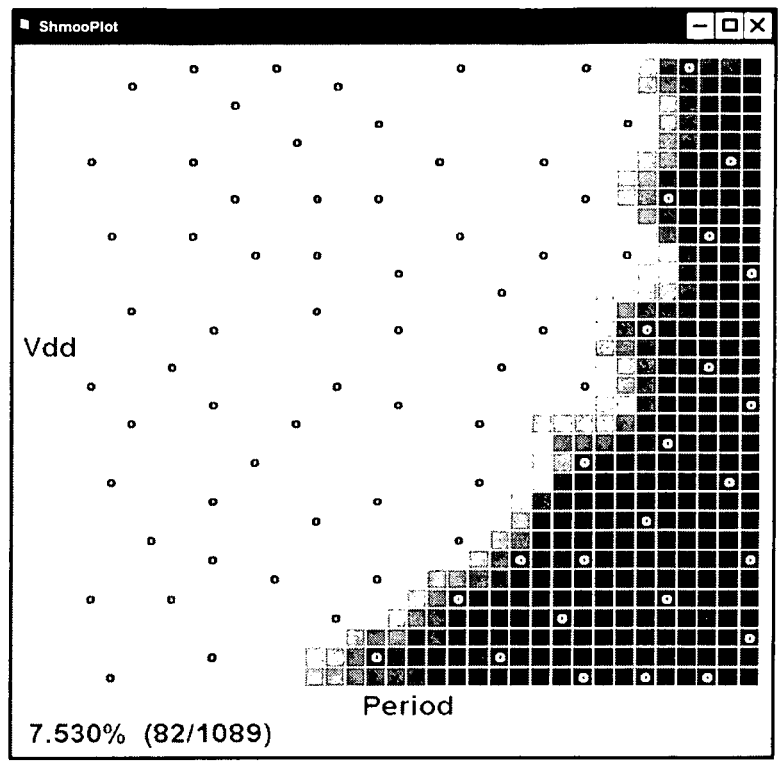
FIGS. 10 to 10c show three phases of the shmoo plot of FIG. 1 generated using progressive adaptive random sampling.
Figure 10B:
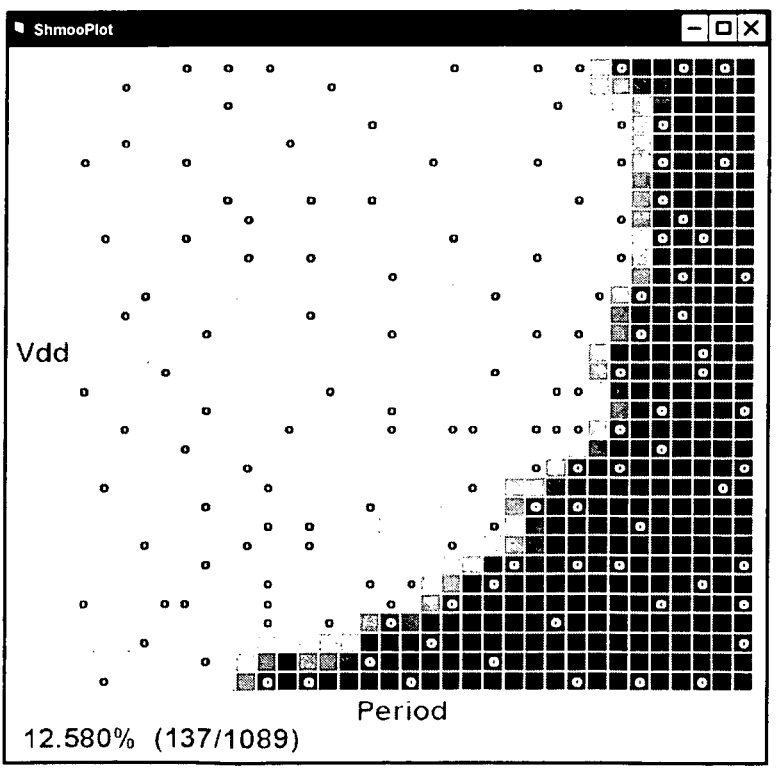
Figure 10C:
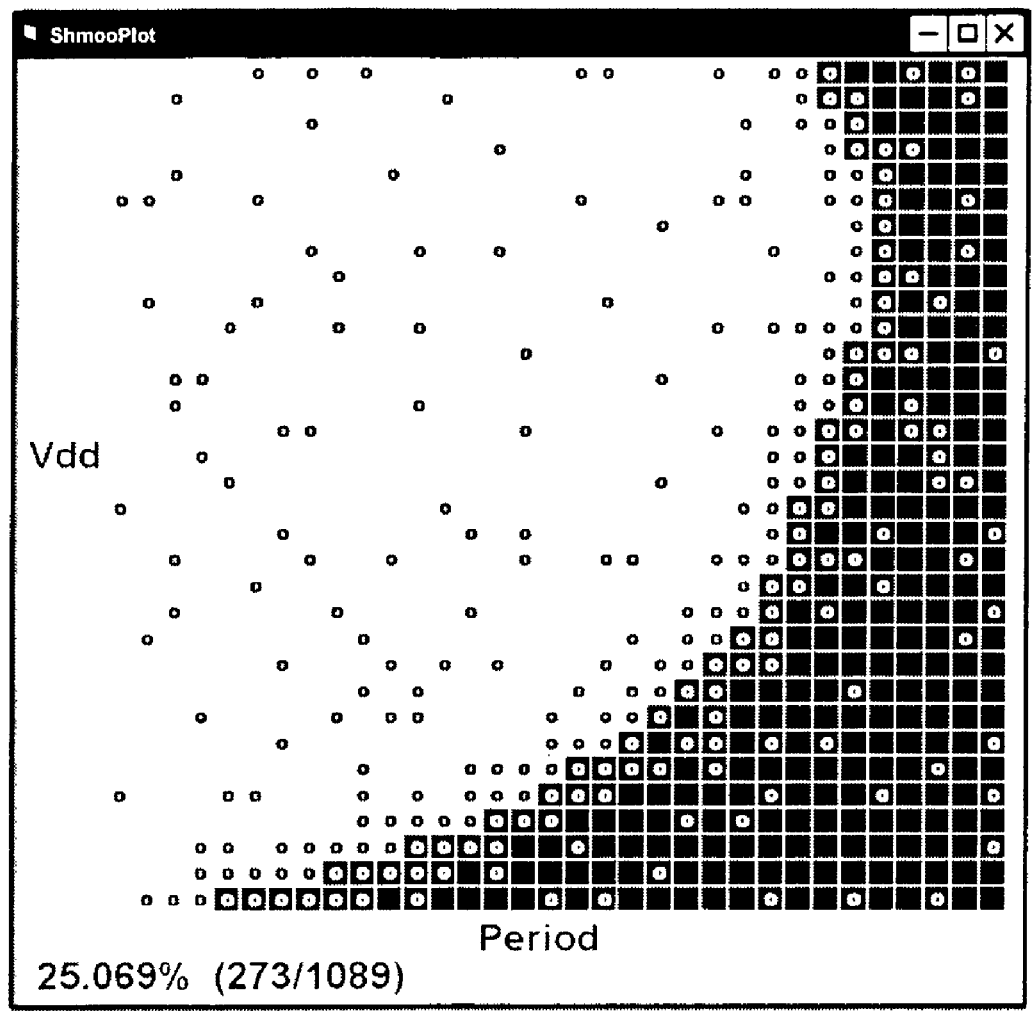

FIGS. 10a to 10c show the result of process 60 performed to generate the shmoo plot of FIG. 1 using progressive adaptive random sampling. As above, sampled points are identified by an O. FIG. 10a shows a shmoo plot that is generated after completing progressive uniform sampling with 7.5% of the points sampled. FIG. 10b shows a shmoo plot that is generated after completing two phases of progressive adaptive sampling with 12.6% of the points sampled. FIG. 10c shows a shmoo plot that is generated after completing progressive adaptive sampling with 25.1% of points sampled. The shmoo plot of FIG. 10c is substantially identical to that of FIG. 1.

In the examples of FIGS. 9a to 9c and 10a to 10c, it is only necessary to actually sample 20-25% of the points in the shmoo plot of FIG. 1 to reproduce the shmoo plot.

Figure 11A:
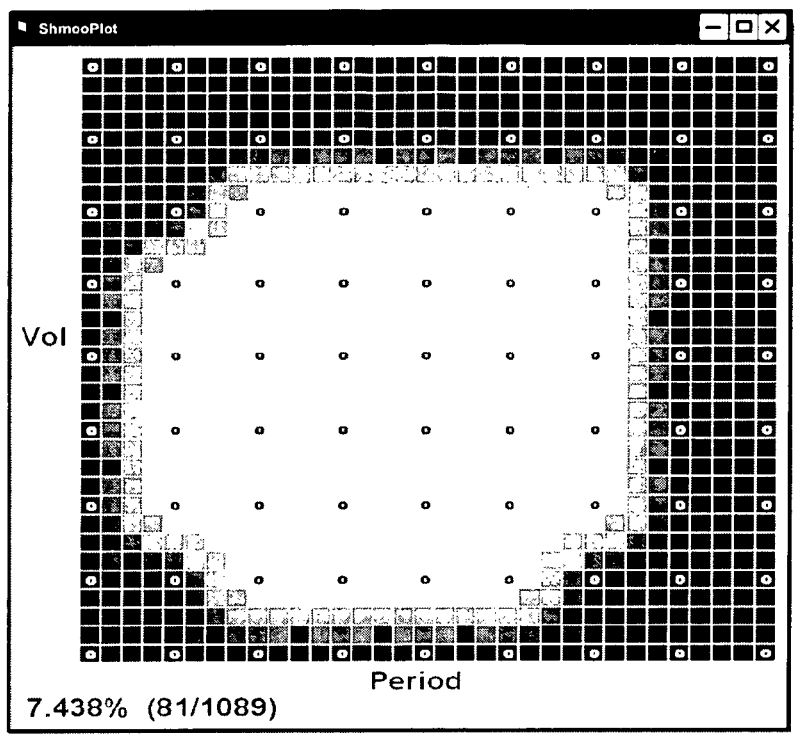
FIGS. 11a to 11c show three phases of the shmoo plot of FIG. 2 generated using progressive adaptive grid sampling.
Figure 11B:
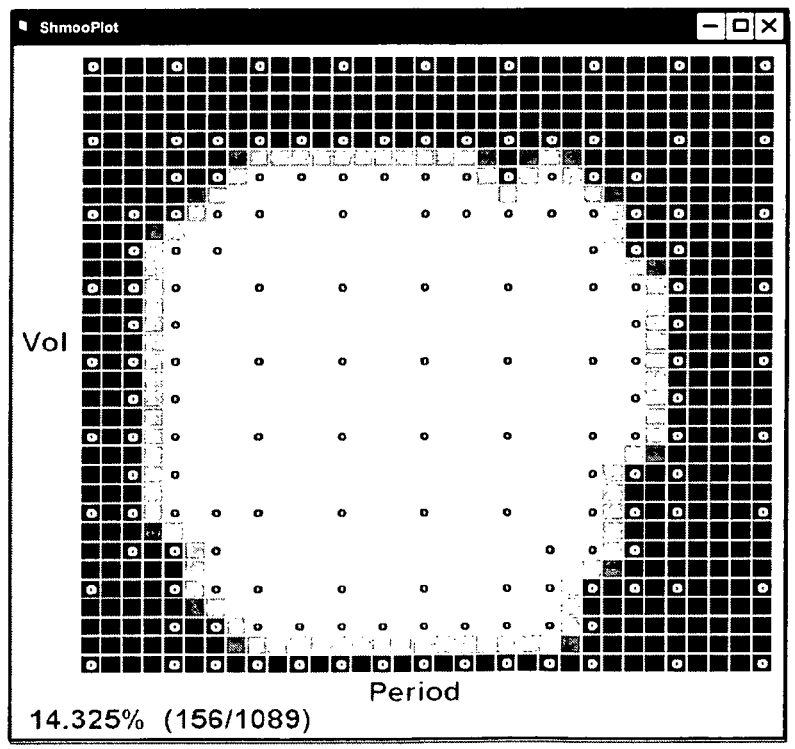
Figure 11C:
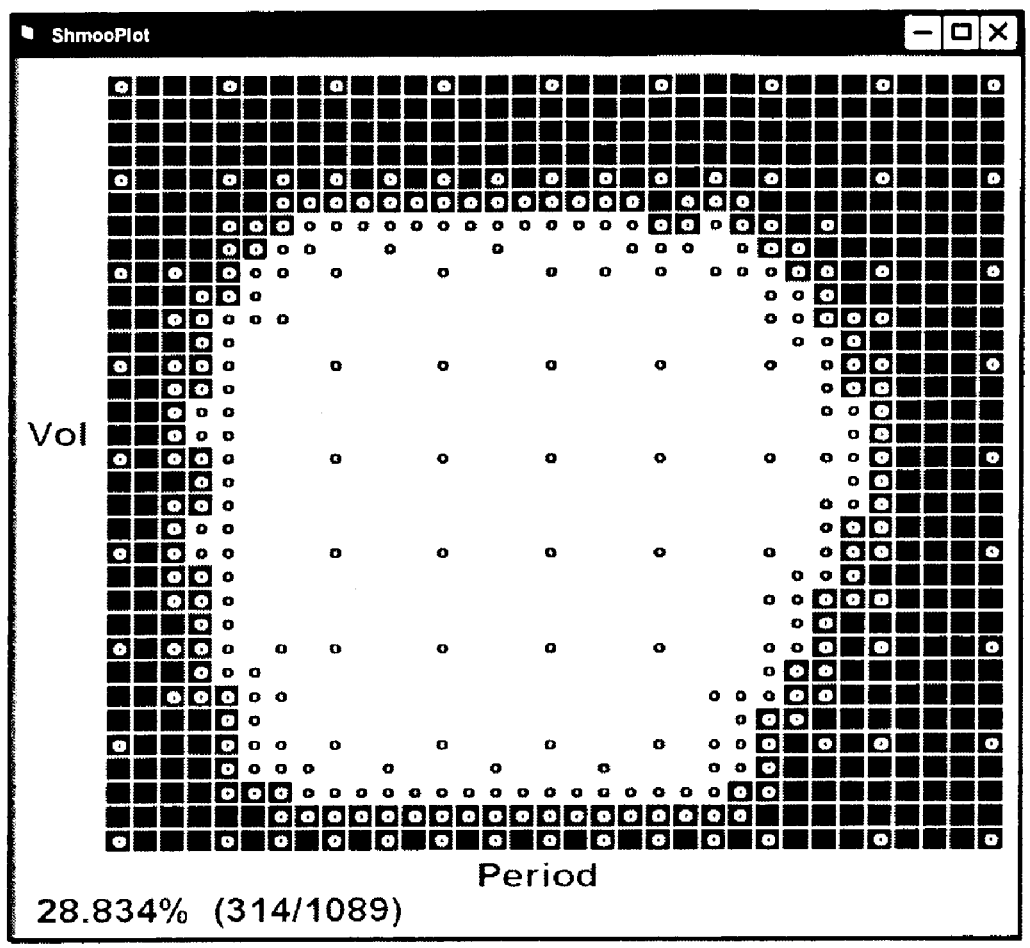

FIGS. 11a to 11c show the result of process 60 performed to generate the shmoo plot of FIG. 2 using progressive adaptive grid sampling. As above, sampled points are identified by an O. FIG. 11a shows a shmoo plot that is generated after completing progressive uniform sampling with 7.4% of the points sampled. FIG. 11b shows a shmoo plot that is generated after completing four phases of adaptive sampling with 14.3% of the points sampled. FIG. 11c shows a shmoo plot that is generated after completing progressive adaptive sampling with 28.8% of points sampled. The shmoo plot of FIG. 11c is substantially identical to that of FIG. 2.

Figure 12A:
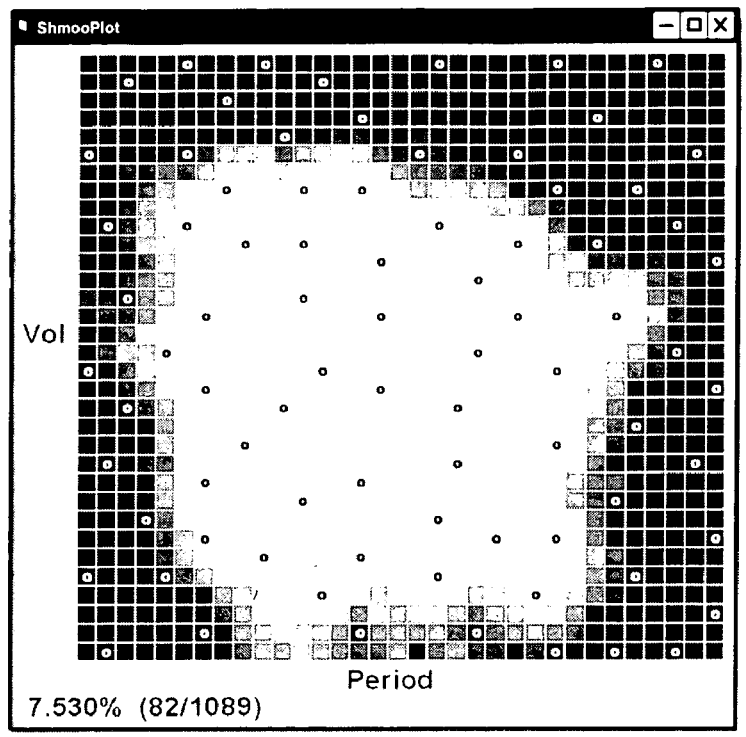
FIGS. 12 to 12c show three phases of the shmoo plot of FIG. 2 generated using progressive adaptive random sampling.
Figure 12B:
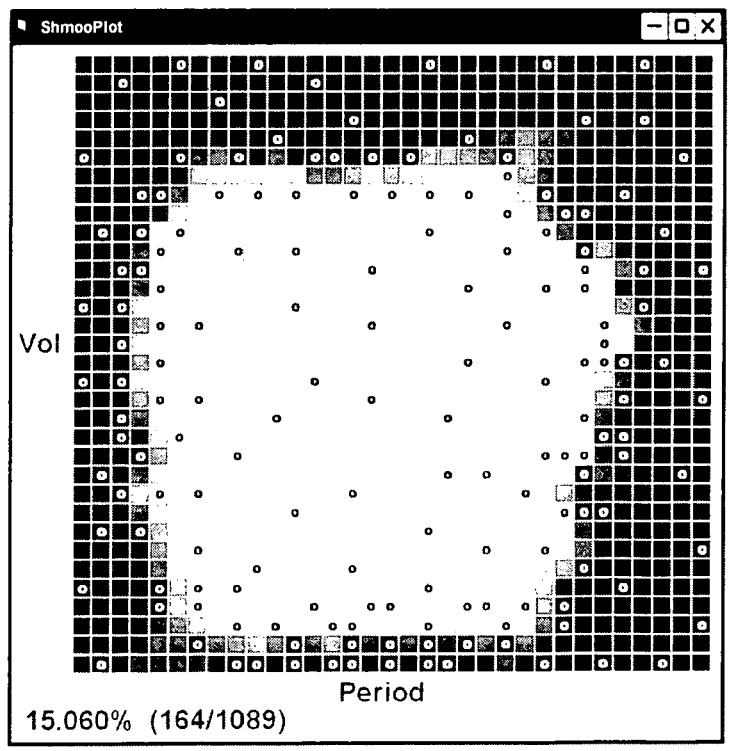
Figure 12C:
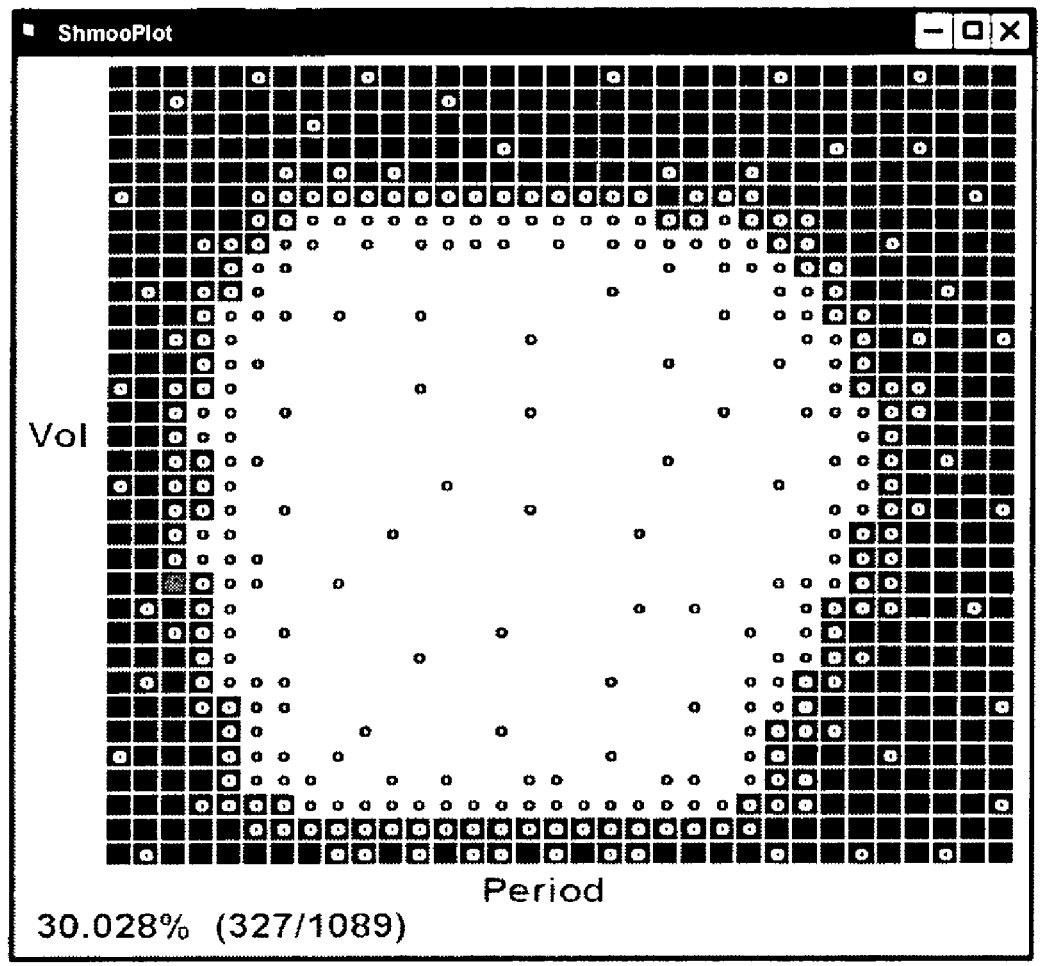

FIGS. 12a to 12c show the result of process 60 performed to generate the shmoo plot of FIG. 2 using progressive adaptive random sampling. As above, sampled points are identified by an O. FIG. 12a shows a shmoo plot that is generated after completing progressive uniform sampling with 7.5% of the points sampled. FIG. 12b shows a shmoo plot that is generated after completing three phases of progressive adaptive sampling with 15.1% of the points sampled. FIG. 12c shows a shmoo plot that is generated after completing progressive adaptive sampling with 30.0% of points sampled. The shmoo plot of FIG. 12c is substantially identical to that of FIG. 2.

In the examples of FIGS. 11a to 11c and 12a to 12c, it is only necessary to actually sample 30% of the points in the shmoo plot of FIG. 2 to reproduce the shmoo plot.

Figure 13A:
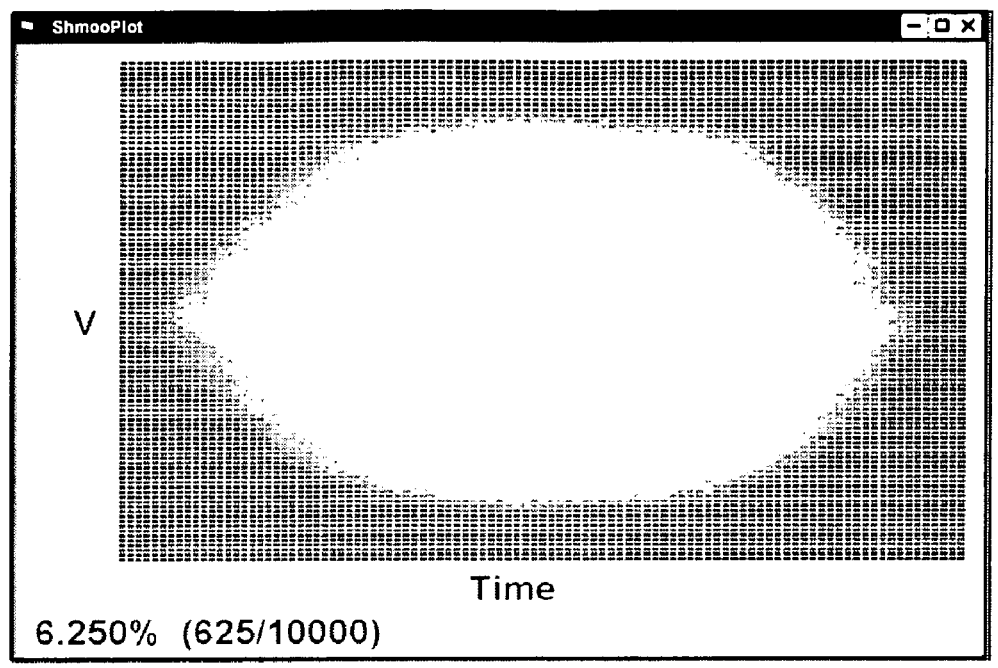
FIGS. 13a to 13f show phases of the shmoo plot of FIG. 3 generated using progressive adaptive grid sampling.
Figure 13B:
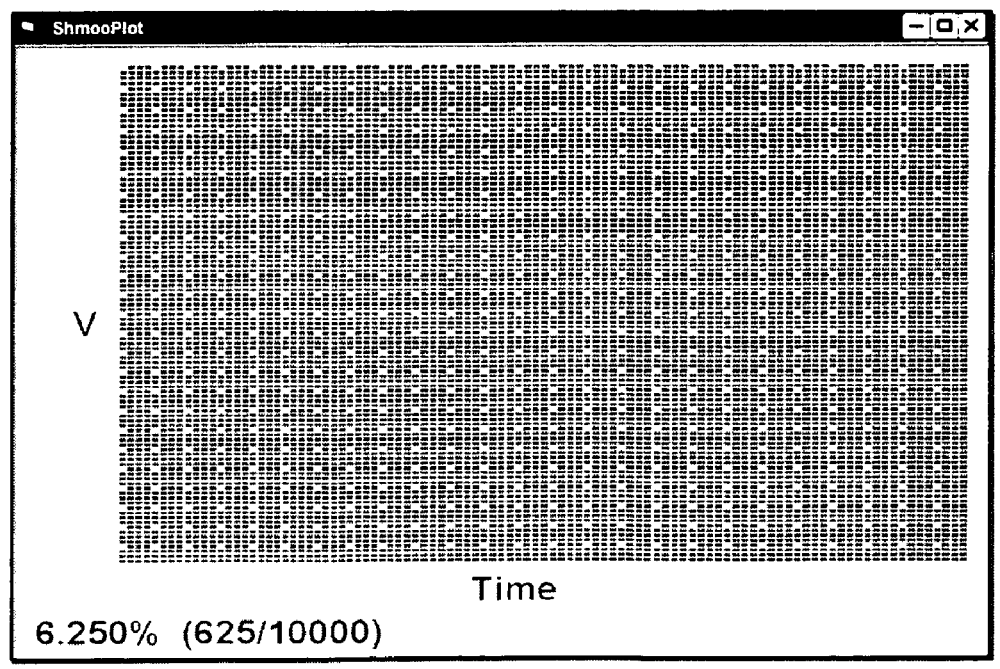
Figure 13C:
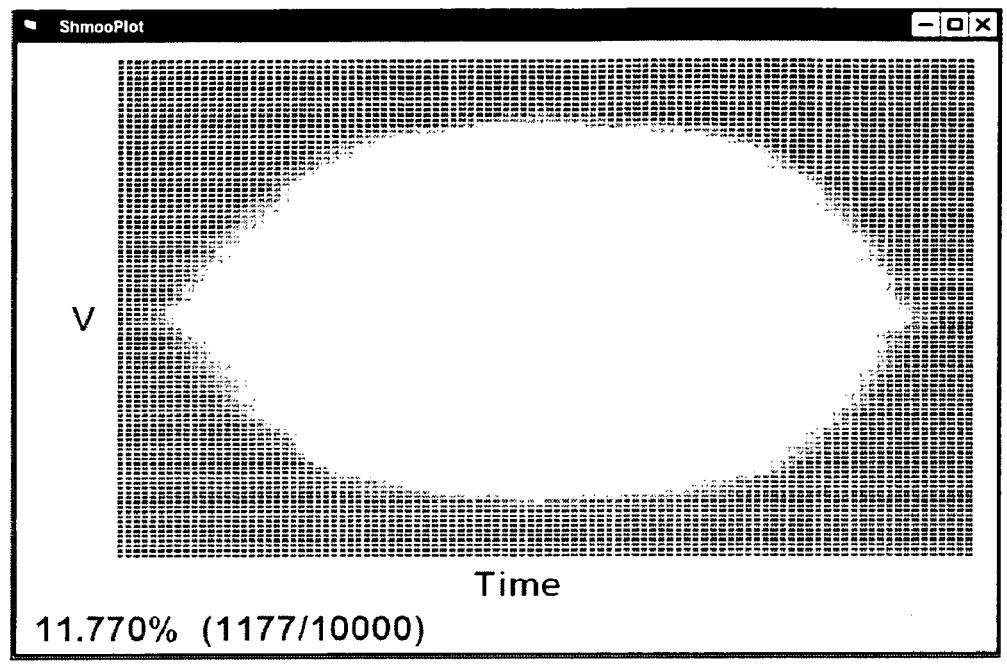
Figure 13D:
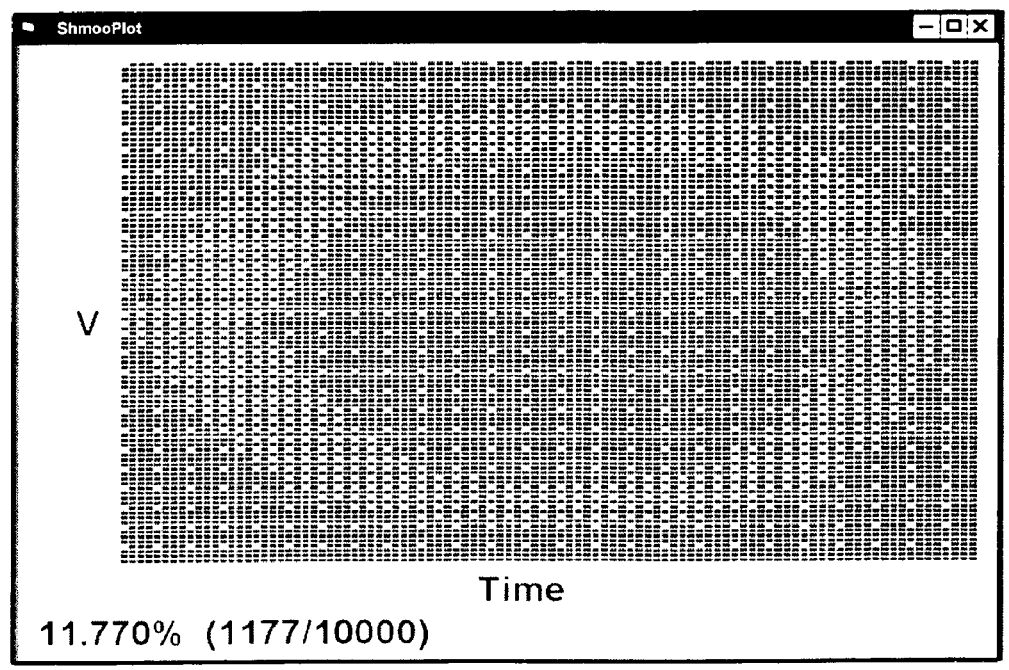
Figure 13E:
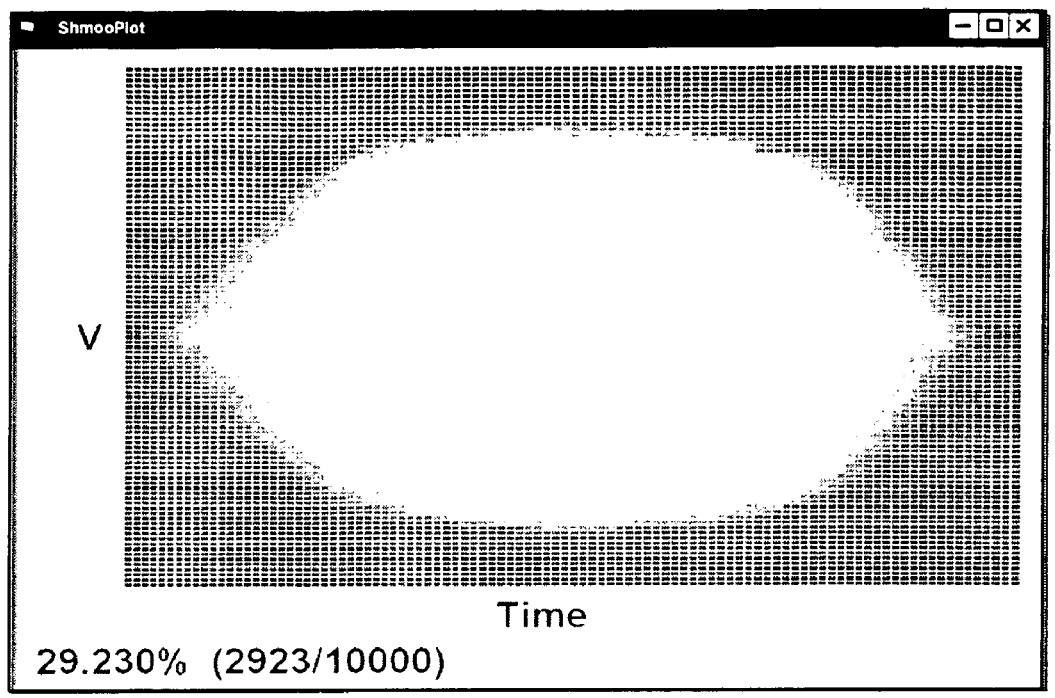
Figure 13F:
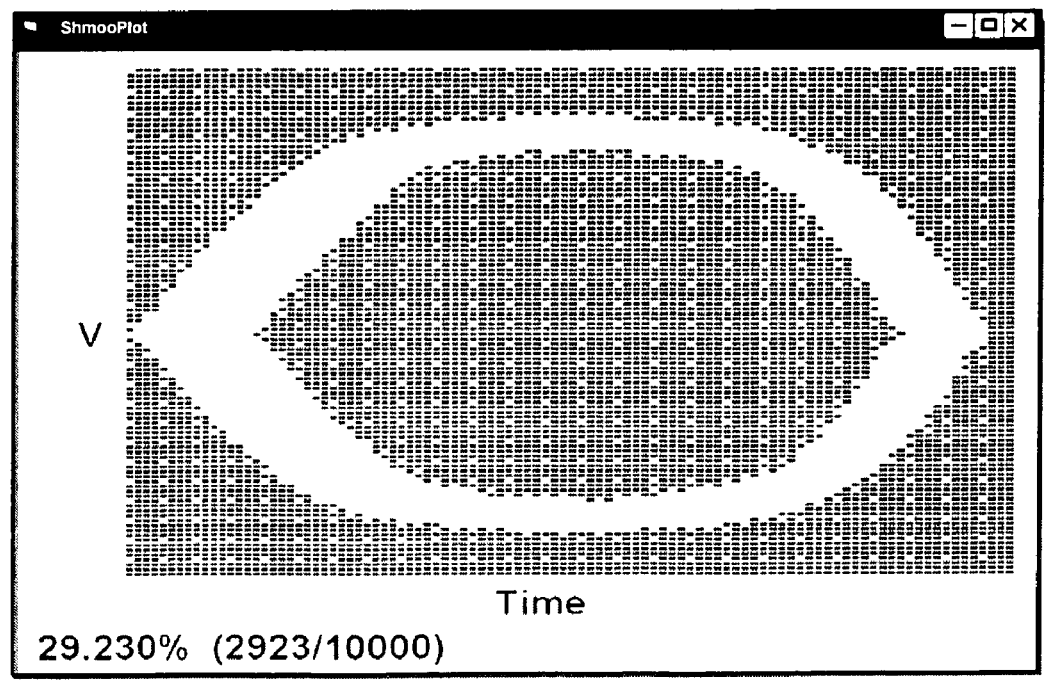

FIGS. 13a to 13f show the result of process 60 performed to generate the shmoo plot of FIG. 3 using progressive adaptive grid sampling. As above, sampled points are identified by an O. FIG. 13a shows a shmoo plot that is generated after completing progressive uniform sampling with 6.25% of the points sampled. FIG. 13b shows a plot of the points sampled in FIG. 13a, where the sampled points are shown in white. FIG. 13c shows a shmoo plot that is generated after completing four phases of adaptive sampling with 11.8% of the points sampled. FIG. 13d shows a plot of the points sampled in FIG. 13c. FIG. 13e shows a shmoo plot that is generated after completing progressive adaptive sampling with 29.2% of points sampled. This shmoo plot is substantially identical to the original shmoo plot of FIG. 3. FIG. 13f shows a plot of the points sampled in FIG. 13e.

Figure 14A:
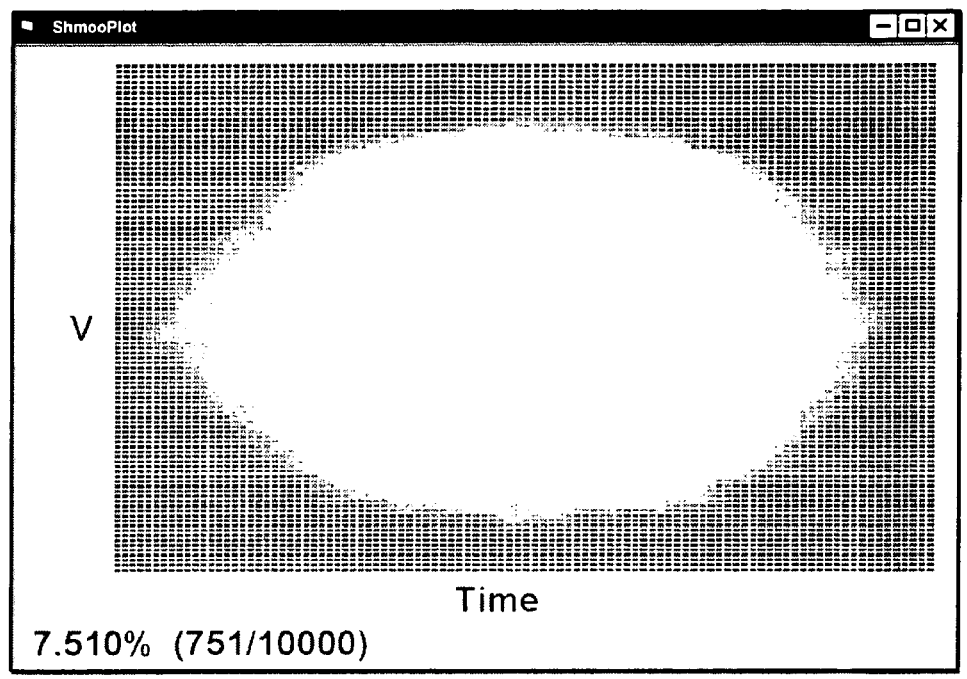
FIGS. 14a to 14f show phases of the shmoo plot of FIG. 3 generated using progressive adaptive random sampling.
Figure 14B:
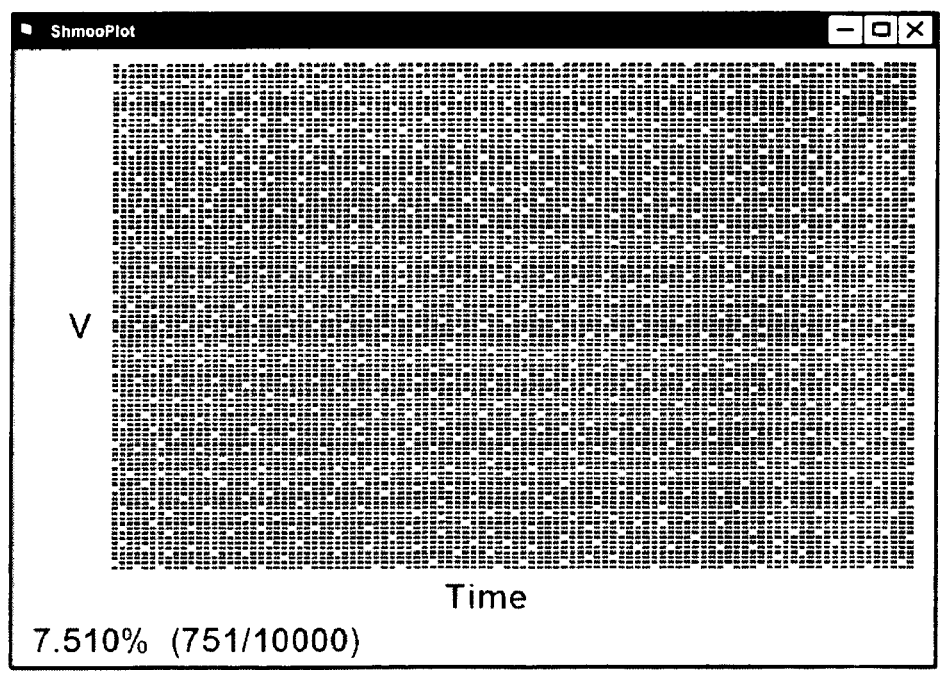
Figure 14C:
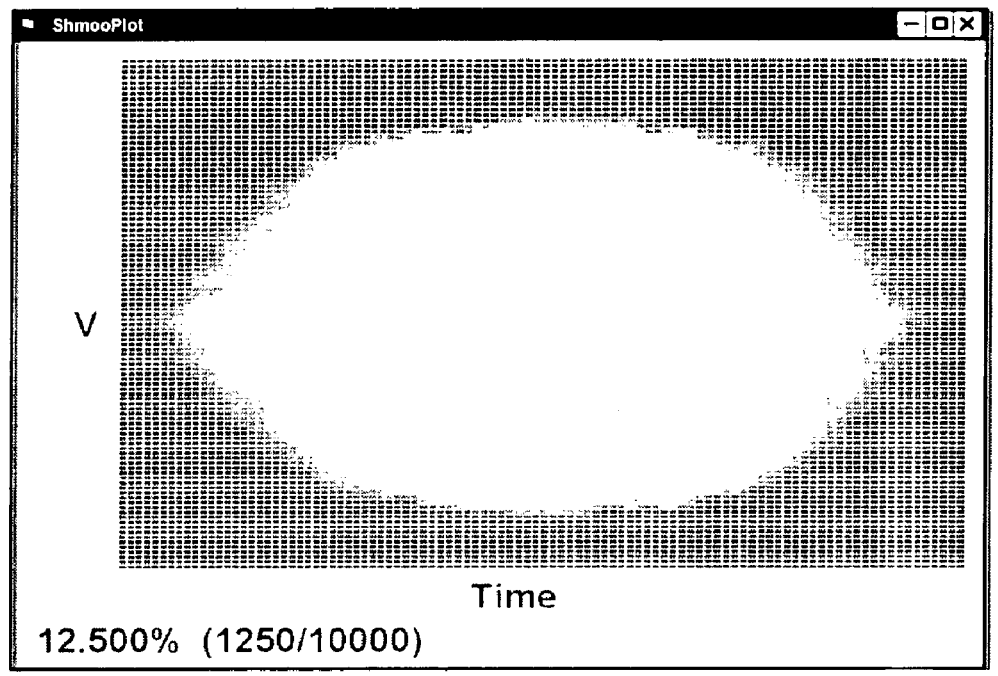
Figure 14D:
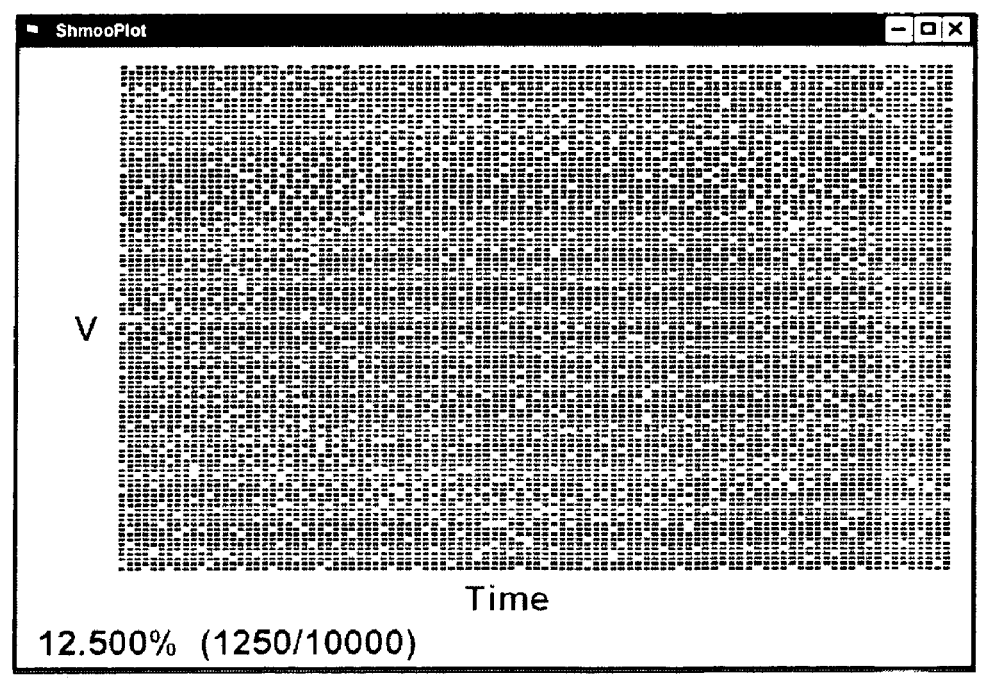
Figure 14E:
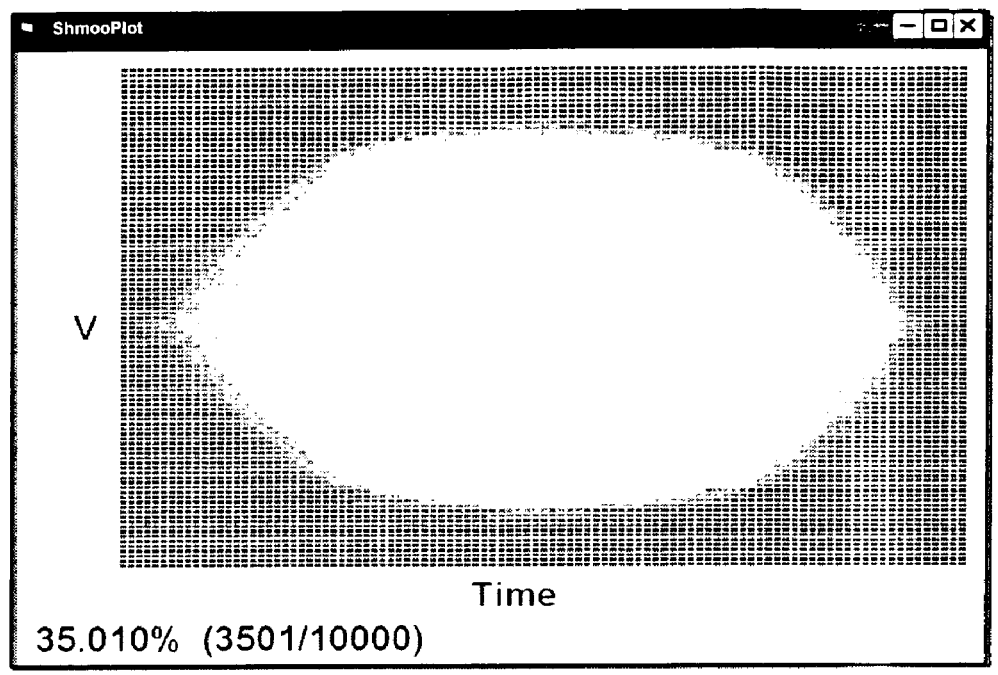
Figure 14F:
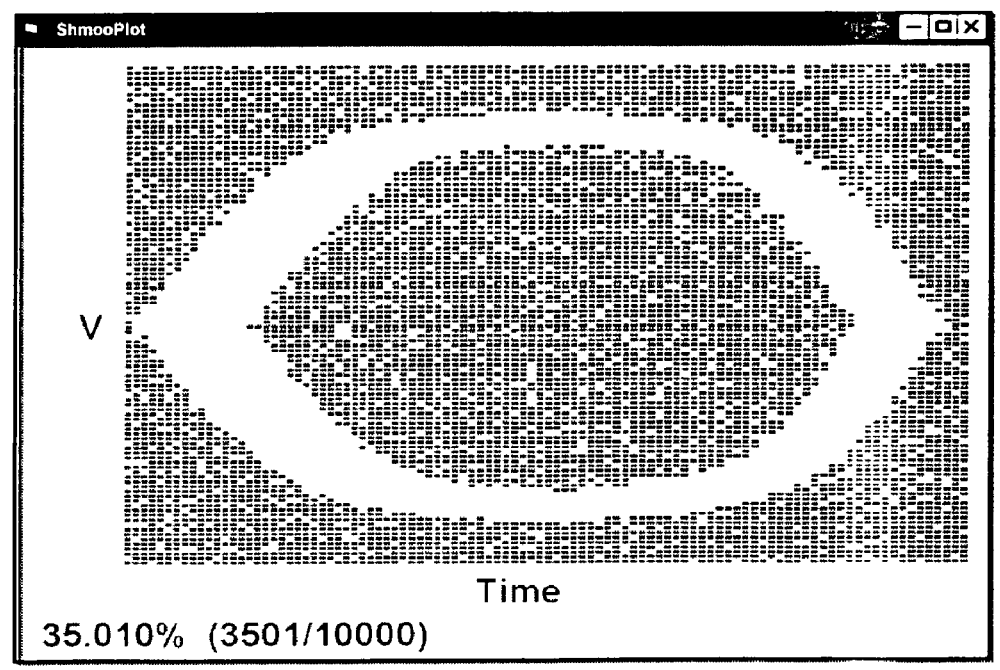

FIGS. 14a to 14f show the result of process 60 performed to generate the shmoo plot of FIG. 3 using progressive adaptive random sampling. As above, sampled points are identified by an O. FIG. 14a shows a shmoo plot that is generated after completing progressive uniform sampling with 7.5% of the points sampled. FIG. 14b shows a plot of the points sampled in FIG. 12a, where the sampled points are shown in white. FIG. 14c shows a shmoo plot that is generated after completing two phases of adaptive sampling with 12.5% of the points sampled. FIG. 14d shows a shmoo plot of the points sampled in FIG. 14c. FIG. 14e shows a shmoo plot that is generated after completing progressive adaptive sampling with 35.0% of points sampled. This shmoo plot is substantially identical to the original shmoo plot of FIG. 3. FIG. 14f shows a shmoo plot of the points sampled in FIG. 14e.

In the examples of FIGS. 13a to 13f and 14a to 14f, it is only necessary to actually sample 30-35% of the points in the shmoo plot of FIG. 3 to reproduce the shmoo plot.

One of the advantages of process 60 is that it, generally, will not miss small features of a shmoo plot. That is, process 60 may continue sampling a shmoo plot by alternating between progressive and adaptive sampling until the shmoo plot is completely sampled. To demonstrate the ability of process to find small features in a shmoo plot, the test shmoo plot of FIG. 15 will be sampled, as shown in FIGS. 16a to 16c and 17a to 17c.

Figure 15:
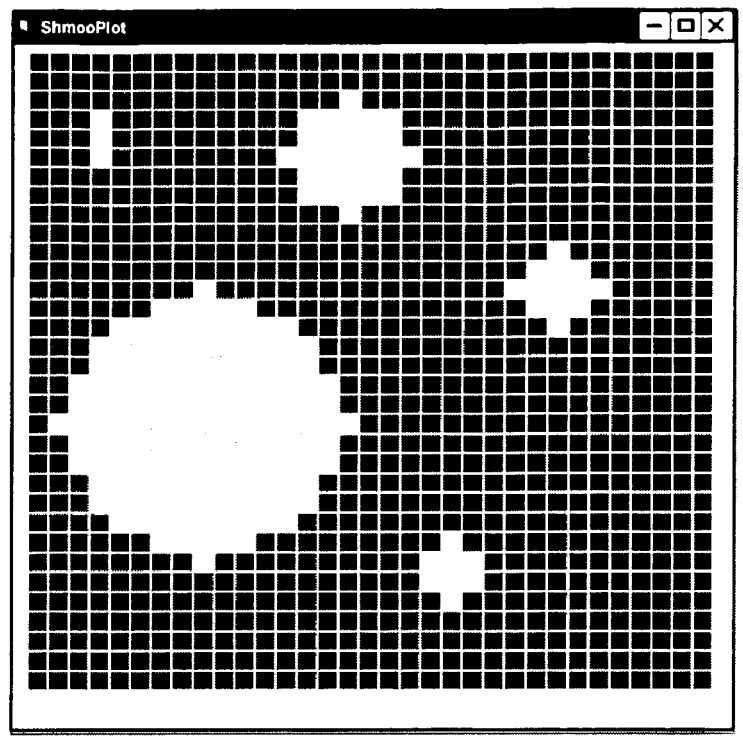
FIG. 15 shows an example of a shmoo plot having different size features.
Figure 16A:
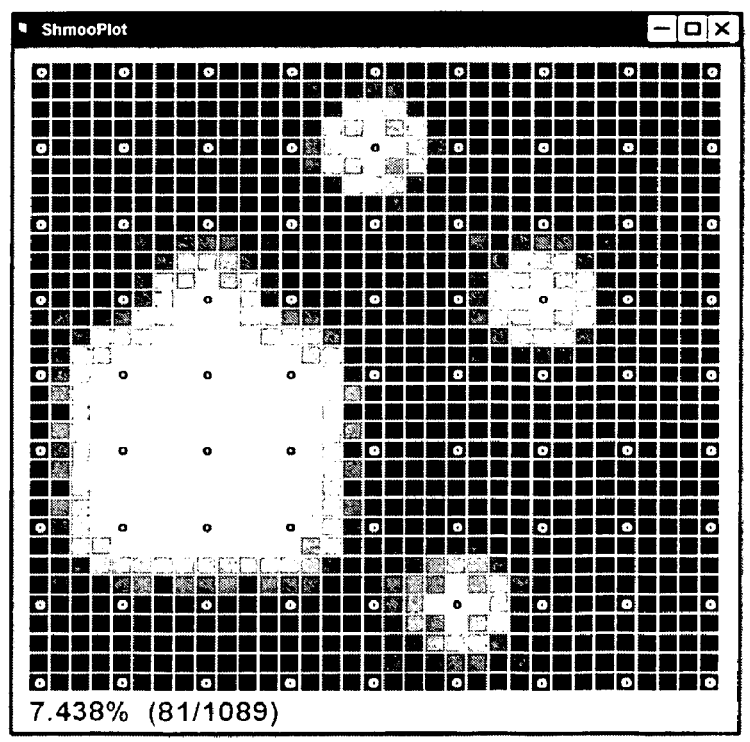
FIGS. 16a to 16c show three phases of the shmoo plot of FIG. 15 generated using progressive adaptive grid sampling.
Figure 16B:
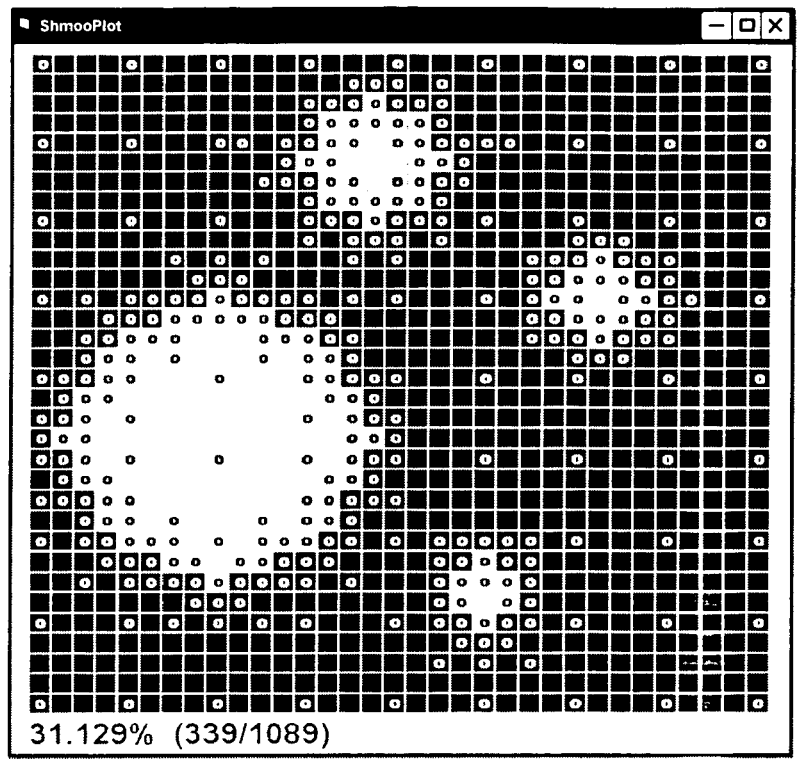
Figure 16C:
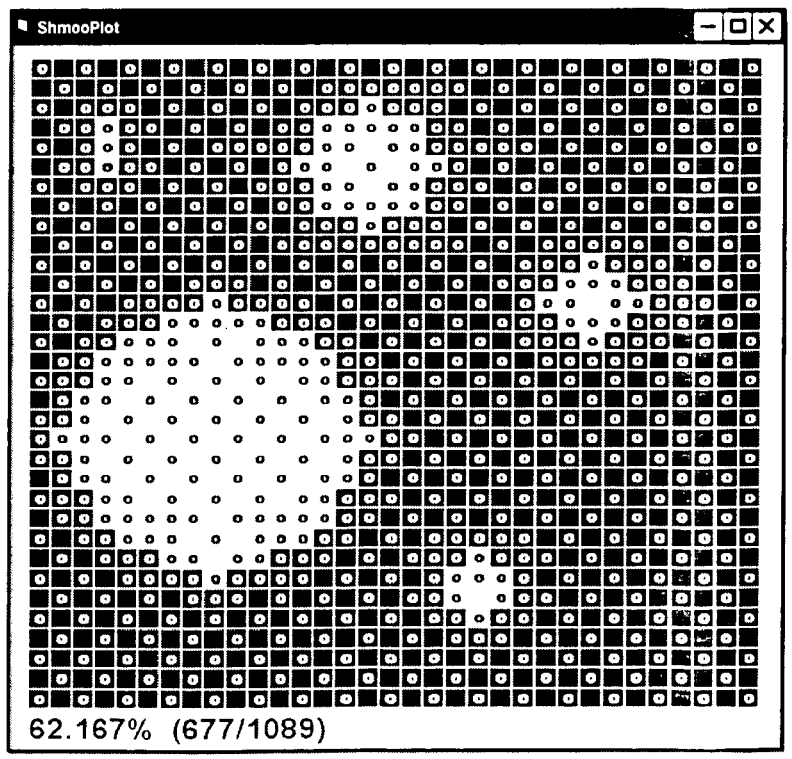

FIGS. 16a to 16c show the result of process 60 performed to generate the shmoo plot of FIG. 15 using progressive adaptive grid sampling. Adaptive sampling completes after 31.1% of the shmoo plot is sampled. After this, progressive sampling resumes until a new feature is discovered, and then adaptive sampling resumes. All features in the shmoo plot are found with 62.2% of the shmoo plot sampled.

Specifically, FIG. 16a shows a shmoo plot that is generated after completing after completing progressive uniform sampling with 7.4% of the points sampled. FIG. 16b shows a shmoo plot that is generated after completing adaptive sampling with 31.1% of the points sampled. FIG. 16c shows a shmoo plot that is generated after completing additional phases of progressive and adaptive sampling with 62.2% of points sampled. The shmoo plot of FIG. 16c is substantially identical to the original shmoo plot of FIG. 15.

Figure 17A:
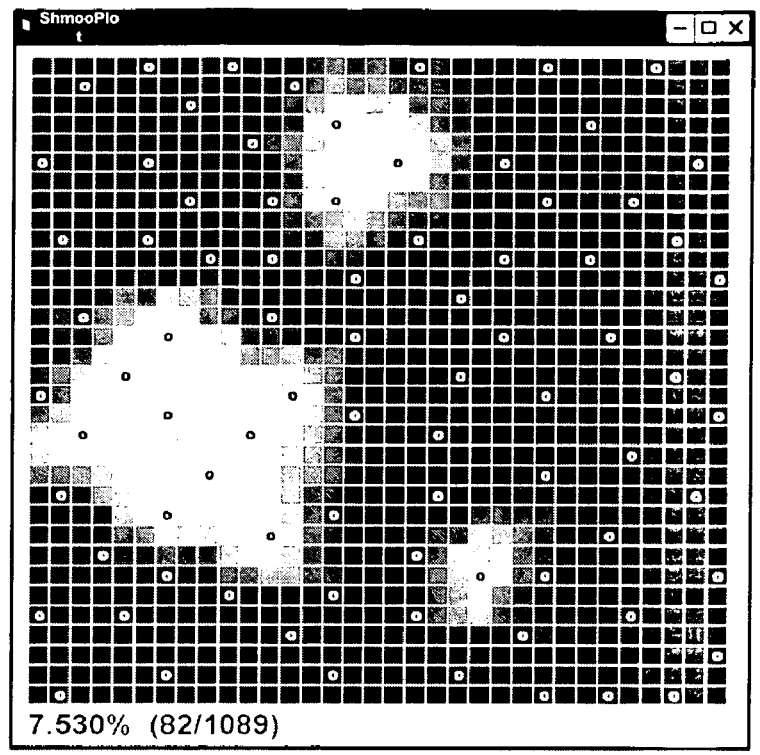
FIGS. 17 to 17c show three phases of the shmoo plot of FIG. 15 generated using progressive adaptive random sampling.
Figure 17B:
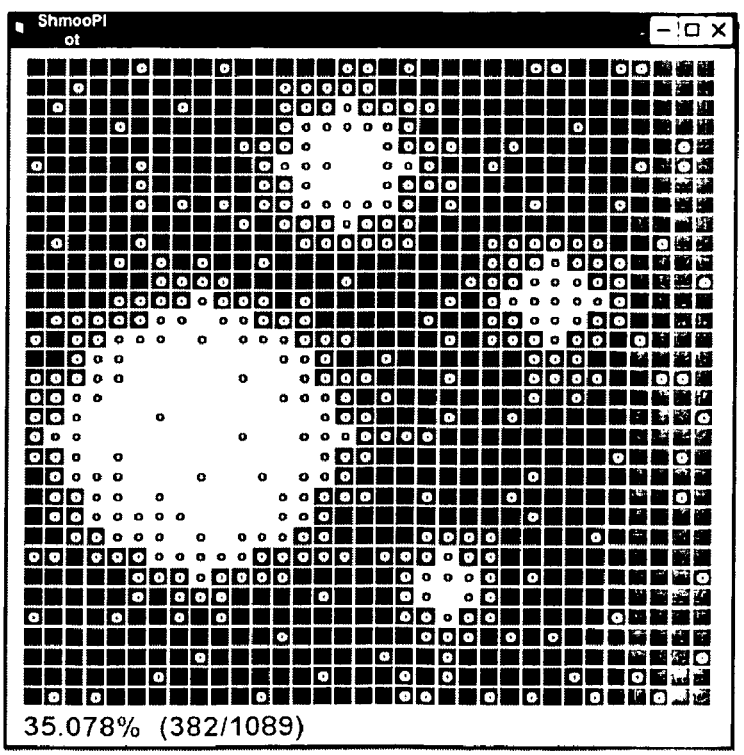
Figure 17C:
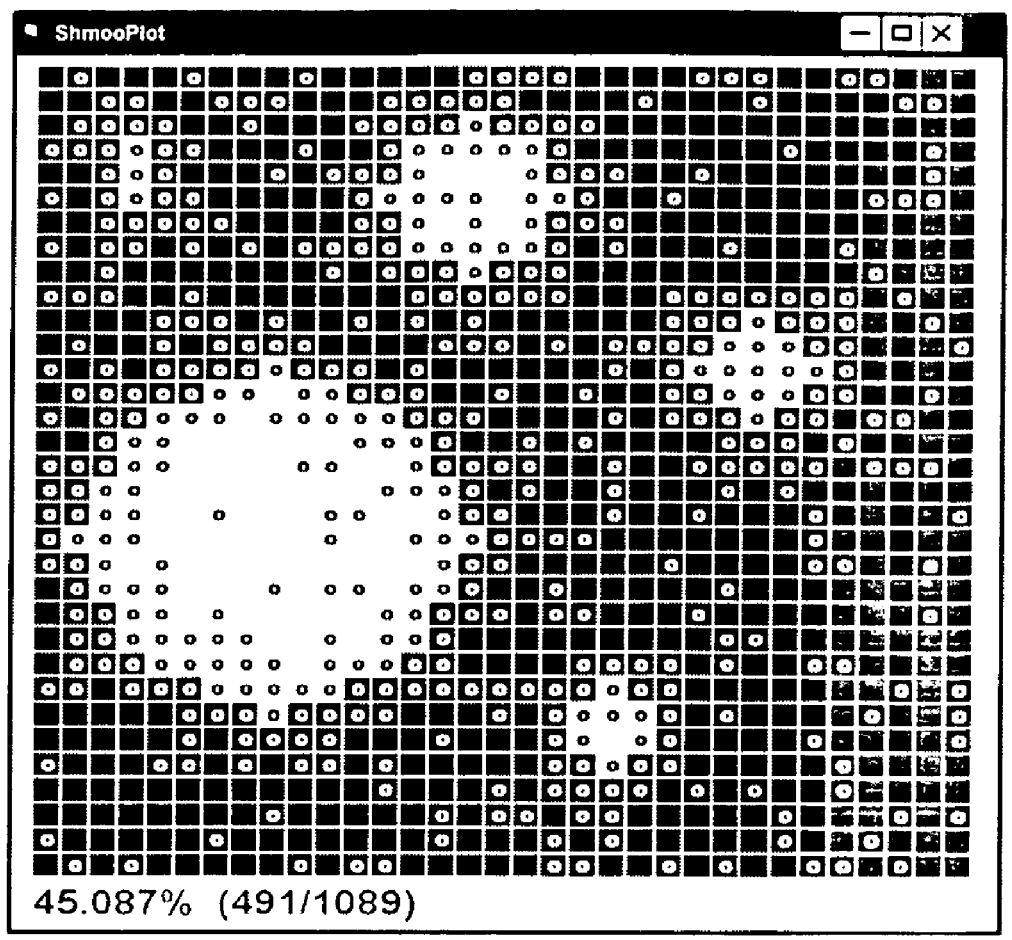

FIGS. 17a to 17c show the result of process 60 performed to generate the shmoo plot of FIG. 15 using progressive adaptive random sampling. Adaptive sampling completes after 35.1% of the shmoo plot is sampled. After this, progressive sampling resumes until a new feature is discovered, and then adaptive sampling resumes. All features in the shmoo plot are found with 45.1% of the shmoo plot sampled.

Specifically, FIG. 17a shows a shmoo plot that is generated after completing progressive uniform sampling with 7.5% of the points sampled. FIG. 17b shows a shmoo plot that is generated after completing adaptive sampling with 35.1% of the points sampled. FIG. 17c shows a shmoo plot that is generated after completing additional phases of progressive and adaptive sampling with 45.1% of points sampled. The shmoo plot of FIG. 15c is substantially identical to the original shmoo plot of FIG. 13.

Progressive adaptive sampling of shmoo plots is used to reduce the time required to acquire a shmoo plot. Therefore, software overhead should be kept relatively low. The software overhead was measured for all the shmoo plots in this section on a computer running Windows® XP® with a 2.8 GHz Pentium® 4 processor with 1 GByte of RAM. On average, the grid-based progressive and adaptive sampling overhead was 250 microseconds per point. On average, the random progressive and adaptive sampling overhead was 110 ms per point. For the shmoo plots used here, these times do not vary significantly with the size of the shmoo plot or with the shape of the shmoo plot.

Given the typical shmoo point acquisition time of 10 ms to 100 ms, software overhead introduced by progressive adaptive sampling is more than offset by a reduction in the number of points that needs to be acquired. In the example of progressive adaptive grid sampling of the $V_{ol}$ vs. period shmoo plot in FIGS. 9a to 9c, the full shmoo plot sampling time with a 10 ms per point acquisition time is about 10.89 s. Using progressive adaptive grid sampling to sample 314 points, the acquisition time is about 3.22 seconds, an approximate 70% time savings over sampling all 1089 points in the shmoo plot. The total software overhead for this scenario is about 78.5 ms, which is about 2.5% overhead or approximately equivalent to taking eight extra points in the shmoo plot. For shmoo plots with longer per-point acquisition times or with code optimization, this percentage may become smaller.

Grid sampling and random sampling have different advantages. Among the advantages of grid sampling are its simplicity and that it requires relatively few points to be sampled. More specifically, sampling at regular intervals produces a uniformly sampled plot without much overhead. In the shmoo examples described herein with simple structure, fewer points need to be sampled using the grid sampling than using random sampling to exactly reproduce the original shmoo plot.

Among the advantages of random sampling are that it requires less overhead. In some implementations, the software overhead needed for random sampling may be less than half of the software overhead needed for grid sampling.

The examples described herein demonstrate that shmoo plot times using progressive and adaptive sampling can be reduced by as much as 80% over row-by-row sampling of the entire shmoo plot. Progressive adaptive sampling is also useful for quickly presenting a user with a low-resolution version of the shmoo plot. In the implementations described herein, no assumptions are made about the shape of shmoo plot features, relatively small features in the shmoo plot will not often be missed, and adaptive sampling may continue until the shmoo plot is completely sampled Process 60 can be implemented, at least in part, via a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. For example, the control signals applied to input switch 62 and output switch 64 may be computer-controlled.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing process 60 can be performed by one or more programmable processors executing one or more computer programs to perform the functions of the calibration process. All or part of process 60 can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

Process 60 is not limited to use with the progressive and adaptive sampling described herein. Any types of progressive and adaptive sampling may be used. In addition, process 60 is not limited to use with shmoo plots, but rather may be used to sample any type of data, images, e.g., grayscale images, or the like.

Elements of different embodiments described herein may be combined to form other embodiments not specifically set forth above. Other embodiments not specifically described herein are also within the scope of the following claims.

What is claimed is:

1. A method of obtaining test data for a device under test, comprising:
   obtaining a first part of the test data by testing the device at first points of a range of parameters using progressive sampling;
   wherein obtaining the first part of the test data comprises:
      performing the progressive sampling to identify a set of first points;
      testing the device at the set of first points to produce first test results; and
      performing an interpolation using the first test results to generate grayscale data corresponding to the first part of the test data;
   identifying second points in the range of parameters based on the grayscale data, the second points being a predefined grayscale percentage away from a predefined value; and
   obtaining a second part of the test data by testing the device at the second points using adaptive sampling.

2. The method of claim 1, wherein obtaining the first part further comprises:
   determining if a number of first points in the set of first points exceeds a threshold; and
   if the number of first points in the set does not exceed the threshold, perform progressive sampling, testing and interpolation.

3. The method of claim 2, wherein, if the number of first points in the set exceeds the threshold, the second part is obtained, wherein obtaining the second part comprises:
   performing the adaptive sampling to identify a set of second points;
   testing the device at the set of second points to produce second test results; and
   performing an interpolation using the second test results to generate the second part of the test data.

4. The method of claim 3, wherein obtaining the second part further comprises:
   setting a metric relating to adaptive sampling;
   determining if there are additional points that meet the metric;
   performing adaptive sampling to identify another set of second points from the additional points;
   testing the device at the other set of second points to produce additional second test results; and
   performing an interpolation using the additional second test results to generate part of the test data.

5. The method of claim 3, further comprising:
   specifying parameters that encompass the test data, the parameters defining plural points that include the set of first points and the set of second points;
   determining if greater than a predetermined amount of the plural points have been subjected to testing; and
   if greater than the predetermined amount of the plural points have not been subjected to testing, obtaining a third part of the test data by testing the device at third points identified using progressive sampling.

6. The method of claim 1, further comprising:
   performing an interpolation using the second part of the test data to obtain missing parts of the test data; and
   displaying the test data using the first and second parts and the missing parts.

7. The method of claim 1, wherein the parameters define a grid having first and second dimensions, the first dimension corresponding to a first parameter relating to the device and the second dimension corresponding to a second parameter relating to the device.

8. The method of claim 1, wherein the device comprises a semiconductor device and the test data is represented as a shmoo plot.

9. One or more machine-readable media configured to store instructions, which are executable, for use in obtaining test data for a device under test, the one or more machine-readable media being tangible media, the instructions for causing at least one machine to perform the following functions:
   obtaining a first part of the test data by testing the device at first points of a range of parameters using progressive sampling;
   wherein obtaining the first part of the test data comprises:
      performing the progressive sampling to identify a set of first points;
      testing the device at the set of first points to produce first test results; and
      performing an interpolation using the first test results to generate grayscale data corresponding to the first part of the test data;

identifying second points in the range of parameters based on the grayscale data, the second points being a predefined grayscale percentage away from a predefined value; and obtaining a second part of the test data by testing the device at the second points using adaptive sampling.

10. The one or more machine-readable media of claim 9, wherein obtaining the first part further comprises:

determining if a number of first points in the set of first points exceeds a threshold; and if the number of first points in the set does not exceed the threshold, perform progressive sampling, testing and interpolation.

11. The one or more machine-readable media of claim 10, wherein, if the number of first points in the set exceeds the threshold, the second part is obtained, wherein obtaining the second part comprises:

performing the adaptive sampling to identify a set of second points;

testing the device at the set of second points to produce second test results; and performing an interpolation using the second test results to generate the second part of the test data.

12. The one or more machine-readable media of claim 11, wherein obtaining the second part further comprises:

setting a metric relating to adaptive sampling;

determining if there are additional points that meet the metric;

performing adaptive sampling to identify another set of second points from the additional points;

testing the device at the other set of second points to produce additional second test results; and performing an interpolation using the additional second test results to generate part of the test data.

13. The one or more machine-readable media of claim 11, wherein the instructions are also for causing the at least one machine to perform the following functions:

specifying parameters that encompass the test data, the parameters defining plural points that include the set of first points and the set of second points;

determining if greater than a predetermined amount of the plural points have been subjected to testing; and if greater than the predetermined amount of the plural points have not been subjected to testing, obtaining a third part of the test data by testing the device at third points identified using progressive sampling.

14. The one or more machine-readable media of claim 9, wherein the instructions are also for causing the at least one machine to perform the following functions:

performing an interpolation using the second part of the test data to obtain missing parts of the test data; and displaying the test data using the first and second parts and the missing parts.

15. The one or more machine-readable media of claim 9, wherein the parameters define a grid having first and second dimensions, the first dimension corresponding to a first parameter relating to the device and the second dimension corresponding to a second parameter relating to the device.

16. The one or more machine-readable media of claim 9, wherein the device comprises a semiconductor device and the test data is represented as a shmoo plot.

* * * * *